United States Patent
Shibazaki

(10) Patent No.: US 9,874,823 B2
(45) Date of Patent: *Jan. 23, 2018

(54) EXPOSURE APPARATUS, EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 242 days.

This patent is subject to a terminal disclaimer.

(21) Appl. No.: 14/853,021

(22) Filed: Sep. 14, 2015

(65) Prior Publication Data

US 2016/0004166 A1 Jan. 7, 2016

Related U.S. Application Data

(62) Division of application No. 12/851,857, filed on Aug. 6, 2010, now abandoned.

(Continued)

(30) Foreign Application Priority Data

Aug. 7, 2009 (JP) .................. 2009-184412
Aug. 7, 2009 (JP) .................. 2009-184419

(51) Int. Cl.
*G03B 27/62* (2006.01)
*G03F 7/20* (2006.01)

(52) U.S. Cl.
CPC ........ *G03F 7/70866* (2013.01); *G03F 7/7015* (2013.01); *G03F 7/70716* (2013.01);
(Continued)

(58) Field of Classification Search
CPC .............. G03F 7/7015; G03F 7/70716; G03F 7/70725; G03F 7/70825; G03F 7/70866;
(Continued)

(56) References Cited

U.S. PATENT DOCUMENTS 4,780,617 A 10/1988 Umatate et al.
5,448,332 A 9/1995 Sakakibara et al.
(Continued)

FOREIGN PATENT DOCUMENTS

EP 1 420 298 A2 5/2004
EP 1 596 423 A1 11/2005
(Continued)

OTHER PUBLICATIONS

International Search Report dated Nov. 2, 2010 in corresponding International Application No. PCT/JP2010/004972.
(Continued)

*Primary Examiner* — Christina Riddle
(74) *Attorney, Agent, or Firm* — Oliff PLC

(57) ABSTRACT

A purge cover is equipped whose upper end is connected to an illumination unit and the lower end has a pair of plate sections facing an upper surface of a reticle stage and a reticle via a predetermined clearance. Therefore, gaseous circulation can be substantially blocked via the clearance between the reticle stage and the plate sections. This allows a space which is almost airtight surrounded by the purge cover, the reticle stage and/or the reticle to be formed on the optical path of the illumination light that reaches the projection optical system from the illumination unit. Further, the space above which is almost airtight serves as a purge space that is purged with clean dry air and the like.

14 Claims, 9 Drawing Sheets

Related U.S. Application Data

(60) Provisional application No. 61/272,074, filed on Aug. 13, 2009, provisional application No. 61/272,073, filed on Aug. 13, 2009.

(52) U.S. Cl.
CPC ...... *G03F 7/70725* (2013.01); *G03F 7/70825* (2013.01); *G03F 7/70841* (2013.01); *G03F 7/70875* (2013.01); *G03F 7/70933* (2013.01); *G03F 7/70975* (2013.01)

(58) Field of Classification Search
CPC ............. G03F 7/70875; G03F 7/70933; G03F 7/70975; G03F 7/70841; G03F 7/70775
USPC ......... 355/30, 52, 53, 55, 67–77; 250/492.1, 250/492.2, 492.22, 493.1, 548; 430/5
See application file for complete search history.

(56) References Cited

U.S. PATENT DOCUMENTS

| | | | |
|---|---|---|---|
| 5,534,970 | A | 7/1996 | Nakashima et al. |
| 5,646,413 | A | 7/1997 | Nishi |
| 5,721,605 | A | 2/1998 | Mizutani |
| 5,969,441 | A | 10/1999 | Loopstra et al. |
| 6,208,407 | B1 | 3/2001 | Loopstra |
| 6,590,634 | B1 | 7/2003 | Nishi et al. |
| 6,611,316 | B2 | 8/2003 | Sewell |
| 6,952,253 | B2 | 10/2005 | Lof et al. |
| 7,023,610 | B2 | 4/2006 | Ohtsuki et al. |
| 7,489,389 | B2 | 2/2009 | Shibazaki |
| 7,561,280 | B2 | 7/2009 | Schluchter et al. |
| 2001/0028456 | A1* | 10/2001 | Nishi .................. G03F 7/70733 356/400 |
| 2002/0018190 | A1 | 2/2002 | Nogawa et al. |
| 2002/0041377 | A1 | 4/2002 | Hagiwara et al. |
| 2004/0057031 | A1 | 3/2004 | Hara |
| 2005/0248744 | A1 | 11/2005 | Shibazaki |
| 2006/0082743 | A1 | 4/2006 | Yonekawa et al. |
| 2007/0288121 | A1 | 12/2007 | Shibazaki |
| 2008/0088843 | A1 | 4/2008 | Shibazaki |
| 2009/0059190 | A1* | 3/2009 | Tanaka .................. F16C 29/025 355/30 |
| 2009/0122293 | A1 | 5/2009 | Shibazaki |

FOREIGN PATENT DOCUMENTS

| | | |
|---|---|---|
| JP | H10-22196 A | 1/1998 |
| JP | 2006-114650 A | 4/2006 |
| JP | 2007-093546 A | 4/2007 |
| WO | 99/49504 A1 | 9/1999 |
| WO | 2004/055803 A1 | 7/2004 |
| WO | 2004/073053 A1 | 8/2004 |
| WO | 2005/074014 A1 | 8/2005 |

OTHER PUBLICATIONS

Nov. 2, 2010 Written Opinion of the International Searching Authority issued in International Patent Application No. PCT/JP2010/004972.
Aug. 19, 2013 Office Action issued in Japanese Patent Application No. 2011-525806.
Apr. 21, 2014 Office Action issued in Japanese Patent Application No. 2011-525806.
Aug. 13, 2013 Restriction Requirement issued in U.S. Appl. No. 12/851,857.
Sep. 2, 2014 Office Action issued in U.S. Appl. No. 12/851,857.
Jan. 30, 2015 Notice of Allowance issued in U.S. Appl. No. 12/851,857.
Jun. 19, 2015 Office Action issued in U.S. Appl. No. 12/851,857.

* cited by examiner

EXPOSURE APPARATUS, EXPOSURE METHOD, AND DEVICE MANUFACTURING METHOD

CROSS-REFERENCE TO RELATED APPLICATIONS

This is a Divisional of U.S. patent application Ser. No. 12/851,857 filed Aug. 6, 2010 (now abandoned), which claims the benefit of U.S. Provisional Application No. 61/272,073 filed Aug. 13, 2009, and U.S. Provisional Application No. 61/272,074 filed Aug. 13, 2009. The disclosure of each of the above-identified applications is hereby incorporated herein by reference in its entirety.

BACKGROUND OF THE INVENTION

Field of the Invention

The present invention relates to exposure apparatuses, exposure methods, and device manufacturing methods, and more particularly to an exposure apparatus and an exposure method used in a lithography process to produce electronic devices such as a semiconductor device (an integrated circuit) and a liquid crystal display device, and a device manufacturing method which uses the exposure apparatus or the exposure method.

Description of the Background Art

In recent years, in a lithography process for manufacturing electron devices such as a semiconductor device (an integrated circuit), a liquid crystal display device and the like, especially from the aspect of productivity, a projection exposure apparatus is mainly used which reduces and transfers a pattern of a photomask (a mask) or a reticle (hereinafter generally referred to as a "reticle") that is proportionally enlarged by four to five times the pattern to be formed, onto an object subject to exposure (hereinafter referred to as a "wafer") via a projection optical system.

In this type of exposure apparatus, the exposure wavelength has been shifted more to the short wavelength side so as to achieve high resolution in correspondence with finer integrated circuits. Currently, the mainstream of the wavelength is 248 nm of the KrF excimer laser, or 193 nm of an ArF excimer laser which belongs to the vacuum ultraviolet region having a shorter wavelength than the 248 nm.

However, with finer design rules of the semiconductor devices, haze (fog) defect of the reticle in the lithography process is becoming a major problem. It is said that reticle haze occurs when a substance which becomes the source of the haze forms on the reticle as a result of an acid-base reaction of acids and bases present on the surface of the reticle and in the atmosphere, or a photochemical reaction of organic impurities, and the source of the haze coheres by moisture inclusion and ultraviolet radiation (energy of exposure) and grows in size to be a cause of defects. Currently, as a cause of reticle haze, ammonium sulfate is seen as the biggest problem. While this problem was recognized in the KrF lithography, it came to have a serious influence on the productivity and production cost in the ArF lithography which uses a shorter wavelength (=higher energy).

It is said that removing volatile impurities (mainly, SOx, $NH_3$, organic matter) which are substances responsible for haze, and moisture which is a substance accelerating the reaction of haze generation from a storage environment and a movement environment of the reticle is an effective measure to comprehensively suppress the haze formation on the reticle. As a concrete example of this effective measure, removing the substance accelerating the reaction of haze generation from the space in the periphery of the reticle in the exposure apparatus can be considered, and to be more precise, supplying a purge gas such as clean dry air (CDA) in the space in the periphery of the reticle and replacing the gas (gas purge) can be considered.

Further, recently, from the aspect of improving processing capacity (throughput), for example, a scanning type projection exposure apparatus by the step-and-scan method (that is, the so-called scanning stepper) which relatively scans the reticle and the wafer while maintaining the image-forming relation during exposure so as to obtain a substantially large exposure field using a projection optical system with high NA but a small field which can easily achieve high NA and low aberration has become mainstream.

As a method to achieve the effective measure to comprehensively suppress the haze formation on the reticle, for example, a method in which the entire reticle stage which holds the reticle is covered with a large air-tight shielding container (reticle stage chamber), and the inside (including the reticle stage and the reticle) is purged overall with gas, as is disclosed in, U.S. Patent Application Publication No. 2004/0057031, is considered effective.

However, when such a shielding container is employed, the exposure apparatus increases in size and weight, which increases the installation area (footprint) per exposure apparatus in a clean room of a semiconductor factory which in turn increases the equipment cost (or running cost), and as a result, productivity of semiconductor devices decreases. Further, access to the vicinity of the reticle becomes difficult, which reduces the workability at the time of maintenance of the reticle stage and the like and increases the time required for maintenance, which also leads to a decrease in productivity of the semiconductor devices.

Especially, the scanning type projection exposure apparatus is equipped with a large reticle stage since the reticle has to be scanned at a high speed during exposure, and the shielding container (reticle stage chamber) covering this large reticle stage entirely increases further in size.

Further, in the projection exposure apparatus, an extremely high accuracy is required concerning alignment (overlay) between layers (a layer) of a circuit element. As one of the factors to influence this overlay accuracy, distortion of the pattern which occurs due to thermal expansion of the reticle by irradiation of the exposure light can be given. In the projection exposure apparatus, because high throughput is required along with accuracy, illuminance of the exposure light shows a tendency of increasing more and more. Therefore, it is becoming difficult to satisfy the overlay accuracy which is required, unless temperature control of the reticle is performed positively.

In the past, as a method of performing temperature control of the reticle, a method (for example, refer to Kokai (Japanese Unexamined Patent Application Publication) No. 10-022196) of blowing air (gas) whose temperature is controlled onto the reticle, or a method of closely attaching a cooling plate in an area besides the exposure range of the reticle has been proposed. However, in the former case, there was an inconvenience that in the case the wind speed was increased to improve the heat transfer rate, particles (so-called dust) were blown up, which adhered to the reticle, and caused defects to occur in the circuit element. Meanwhile, in the latter case, there was an inconvenience that each time the reticle was exchanged, the cooling plate had to be attached to the reticle, which extended the reticle exchange time. As well as this, it is becoming difficult to keep the distortion of the pattern within a permissible value merely by cooling the reticle each time the reticle is exchanged.

SUMMARY OF THE INVENTION

According to a first aspect of the present invention, there is provided a first exposure apparatus which synchronously moves a mask and an object and transfers a pattern formed on the mask onto the object, the apparatus comprising: a slider which moves with predetermined strokes in a first direction in which the mask synchronously moves, and holds the mask in a state where an upper surface on both sides in the first direction with the mask in between is substantially flush with the upper surface of the mask; an illumination system which illuminates the mask by an illumination light; and an opposing member which has an opposing surface section that faces the upper surface of the slider and the mask via a predetermined clearance gap, placed on the illumination system side with respect to the slider at a position different from an optical path of the illumination light in the first direction, wherein the upper surface of the mask and the slider are moved proximate to the opposing member at the time of synchronous movement with the object.

According to the apparatus, the apparatus is equipped with an opposing member which has an opposing surface section that faces the upper surface of the slider and the mask via a predetermined clearance gap, placed on the illumination system side with respect to the slider at a position different from an optical path of the illumination light in the first direction, and the upper surface of the mask and the slider are moved proximate to the opposing member at the time of synchronous movement with the object. This allows a space of a substantially airtight state to be formed between the opposing member and the slider and/or the mask, and in the case an optical path space of the illumination light that reaches the mask stage from the illumination system is isolated from the outside, a space of an airtight state which includes the illumination optical path can be formed above the mask. In other words, it no longer becomes necessary to surround the slider holding the mask with a large air-tight shielding container. The slider, in this case, refers not only to a slider (for example, a mask stage) itself, but in the case the slider has an auxiliary member such as eaves and the like, includes these members as well.

According to a second aspect of the present invention, there is provided a second exposure apparatus which synchronously moves a mask and an object and transfers a pattern formed on the mask onto the object, the apparatus comprising: a slider which holds the mask, and moves in a first direction in which the mask is synchronously moved; an illumination system which illuminates the mask by an illumination light; and a cooling member which performs temperature control of the mask, and is placed on the illumination system side with respect to the slider at a position different from an optical path of the illumination light in the first direction, wherein the slider is moved in a state where a surface of the mask is proximal to the cooling member.

According to this apparatus, the apparatus is equipped with a cooling member which performs temperature control of the mask, and is placed facing a surface on the illumination system side of the slider and mask at least on one side in the first direction of the irradiation are of the illumination light between the illumination system and the mask, and the slider is moved in a state where a surface of the mask is proximal to the cooling member. Therefore, the cooling member can perform temperature control (cooling) of the mask held by the slider during scanning exposure.

According to a third aspect of the present invention, there is provided a device manufacturing method, including transferring a pattern on an object using one of the first and second exposure apparatus of the present invention; and developing the object on which the pattern is transferred.

According to a fourth aspect of the present invention, there is provided a first exposure method in which a mask and an object are relatively scanned synchronously in a predetermined direction with respect to an irradiation area by an illumination light, and a pattern formed on the mask is transferred on to the object, the method comprising: setting a cooling area on at least one side in the predetermined direction of the irradiation area of the illumination light in the vicinity of a movement plane of the mask; and cooling the mask which passes through the cooling area during relative scanning of the mask and the object with respect to the irradiation area.

According to a fifth aspect of the present invention, there is provided a second exposure method in which a mask and an object are synchronously moved and a pattern formed on the mask is transferred onto the object, the method comprising: preparing a slider which moves with predetermined strokes in a first direction in which the mask synchronously moves, and holds the mask in a state where an upper surface on both sides in the first direction with the mask in between is substantially flush with the upper surface of the mask; an illumination system which illuminates the mask by an illumination light; and an opposing member which has an opposing surface section that faces the slider and the upper surface of the mask via a predetermined clearance gap, placed on the illumination system side with respect to the slider at position different from an optical path of the illumination light in the first direction, and the upper surface of the mask and the slider are moved proximate to the opposing member at the time of the synchronous movement with the object.

According to a sixth aspect of the present invention, there is provided a second device manufacturing method, including transferring a pattern on an object by one of the first and second exposure methods of the present invention; and developing the object on which the pattern is transferred.

BRIEF DESCRIPTION OF THE DRAWINGS

In the accompanying drawings.

DESCRIPTION OF THE EMBODIMENTS

A First Embodiment

A first embodiment will be described below, with reference to FIGS. 1 to 6.

Figure 1:
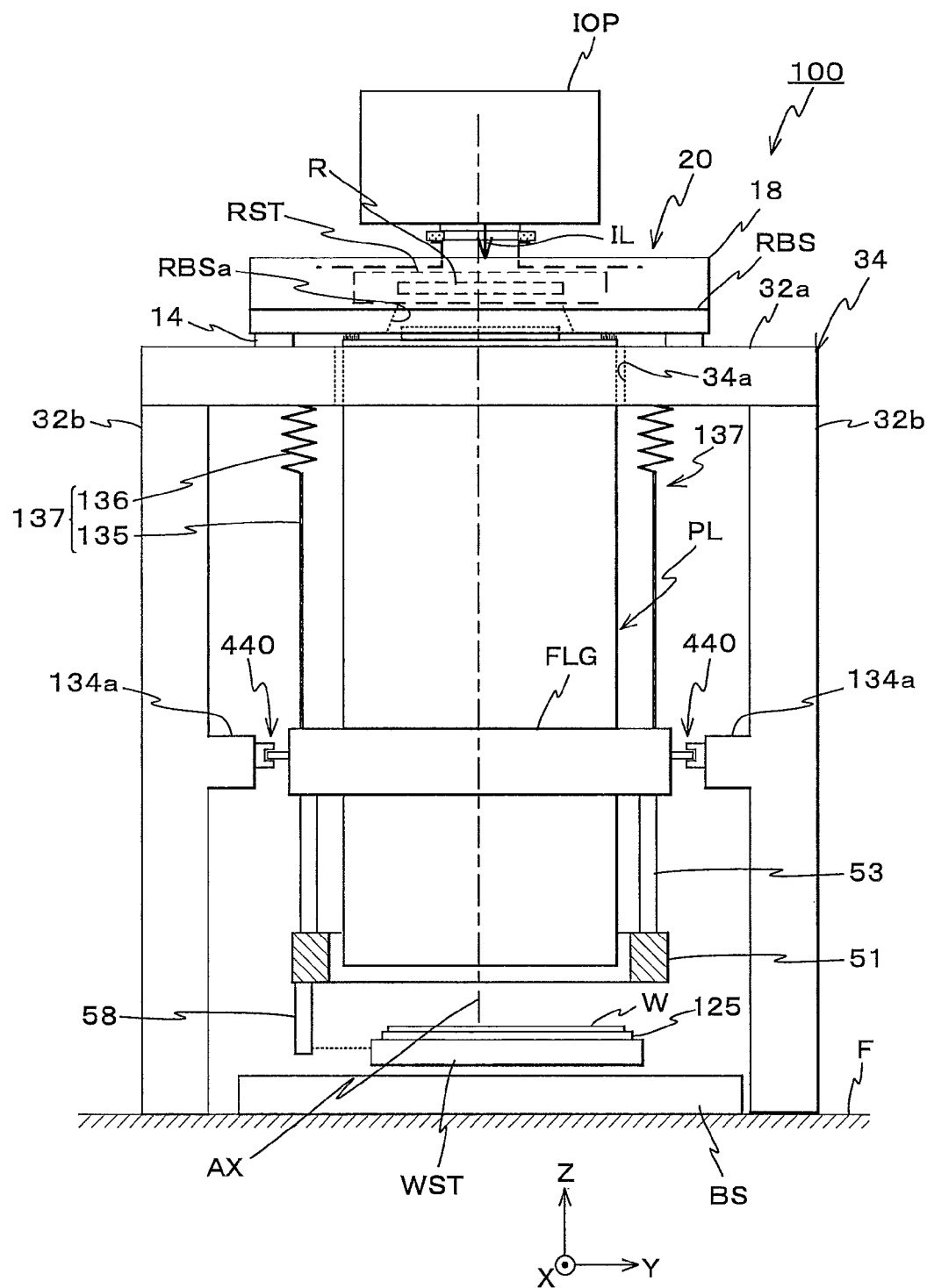
FIG. 1 is a schematic view that shows an exposure apparatus of a first embodiment.

FIG. 1 shows a schematic configuration of an exposure apparatus 100 in the first embodiment. Exposure apparatus 100 is a projection exposure apparatus by the step-and-scan method, or a so-called scanning stepper (also called a scanner). As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination unit IOP, a reticle stage device 20 including a reticle stage RST which moves within a plane parallel to an XY plane holding a reticle R, projection optical system PL, a wafer stage WST which drives a wafer W in an XY two-dimensional direction, a control systems of these sections, and a column 34 which holds reticle stage device 20 and projection optical system PL.

Illumination unit IOP includes a light source and an illumination optical system, irradiates an illumination light (exposure light) IL to an illumination area having a rectangular shape or a circular arc shape that is defined by a field stop (which is also called a masking blade or a reticle blind) placed inside illumination unit IOP, and illuminates reticle R on which a circuit pattern is formed with uniform illuminance. An illumination system similar to illumination unit IOP is disclosed in, for example, U.S. Pat. No. 5,534,970 and the like. In this case, as illumination light IL, for example, an ArF excimer laser light (wavelength: 193 nm) is to be used. Further, a part of illumination light IL is taken out by a beam splitter placed inside the illumination optical system, and illuminance signals from a power monitor which is also called an integrator sensor is sent to a main controller 50.

Reticle stage device 20 is equipped with a reticle stage surface plate RBS placed substantially parallel below illumination unit IOP by a predetermined distance, a reticle stage RST placed on reticle stage surface plate RBS, a counter mass 18 made up of frame shaped member placed on reticle stage surface plate RBS in a state surrounding reticle stage RST, and a reticle stage drive system 340 (refer to FIG. 6) that drives reticle stage RST and the like.

Reticle stage surface plate RBS is supported almost horizontally on a top board section 32a of column 34 via a plurality of (e.g. three) vibration isolation units 14 (the vibration isolation units in the depth of the page surface of FIG. 1 is not shown), as shown in FIG. 1. Reticle stage RST is placed on reticle stage surface plate RBS, and reticle R is held on reticle stage RST. Incidentally, details on a concrete configuration of reticle stage device 20 will be described further later in the description.

As projection optical system PL, for example, a dioptric system is used, consisting of a plurality of lenses (lens elements) that has been disposed along optical axis AX, which is parallel to the Z-axis direction. Projection optical system PL is, for example, both-side telecentric and has a predetermined projection magnification (for example, ¼, or ⅕). Therefore, when the illumination area is illuminated by illumination light IL from illumination unit IOP, illumination light IL having passed through reticle R whose pattern surface is placed so as to conform to a first plane (an object plane) of projection optical system PL forms a reduced image of a circuit pattern (a projected image of part of the circuit pattern) of reticle R within the illumination area, on an area (an exposure area) that is conjugate with the illumination area on wafer W which is placed on the second plane (image plane) side of projection optical system PL and whose surface is coated with a resist (a sensitive agent), via projection optical system PL.

Then, by synchronously driving reticle stage RST and wafer stage WTS, reticle R is relatively driven in the scanning direction (the Y-axis direction) with respect to the illumination area (illumination light IL), and by also relatively moving wafer W in the scanning direction (the Y-axis direction) with respect to the exposure area (illumination light IL), scanning exposure of a shot area (divided area) on wafer W is performed, and a pattern of reticle R is transferred to the shot area. That is, in the embodiment, the pattern of reticle R is generated on wafer W according to illumination unit IOP and projection optical system PL, and then by the exposure of the sensitive layer (resist layer) on wafer W with illumination light IL, the pattern is formed on wafer W.

Around the center in a height direction of a barrel of projection optical system PL, a flange FLG is arranged.

Column 34 is equipped with a plurality of (e.g. three) leg sections 32b (the leg section in the depth of the page surface of FIG. 1 is not shown) whose lower end portions are fixed to a floor surface F and top board section 32a that is supported almost horizontally by the three leg sections 32b. An opening 34 is formed, penetrating the center portion of top board section 32a in a vertical direction (the Z-axis direction). An upper end of projection optical system PL is inserted in opening 34a.

The other end of three suspension support mechanisms 137 (however, the suspension support mechanism in the depth of the page surface of FIG. 1 is not shown) whose one end is fixed to the lower surface side of top board section 32a, is connected to flange FLG, and this allows projection optical system PL to be supported by suspension by top board section 32a. Each of the three suspension support mechanisms 137, for example, includes a coil spring 136 that is a connecting member having a flexible structure and a wire 135. Since coil spring 136 vibrates like a pendulum in a direction perpendicular to optical axis (the Z-axis) of projection optical system PL, coil spring 136 has a vibration-free function (a function of preventing vibration of the floor from traveling to projection optical system PL) in the direction perpendicular to the optical axis. Further, coil spring 136 has a high vibration-free function also in a direction parallel to the optical axis. Incidentally, projection optical system PL can be supported, for example, by leg sections 32b of column 34 via flange FLG, without being supported by suspension. Further, projection optical system PL can be mounted, for example, on a support member (a frame member) referred to as a barrel platform or a metrology frame via flange FLG, and the support member can be supported by suspension by top board section 32a, or supported by leg sections 32b of column 34.

Further, in the vicinity of a center portion in the Z-axis direction of each leg section 32b of column 34, a protruding section 134a is provided projecting toward the inside, and between each protruding section 134a and the outer periphery section of flange FLG of projection optical system PL, a drive system 440 is arranged. Drive system 40, for example, includes a voice coil motor that drives projection optical system PL in a radius direction of the barrel, and a voice coil motor that drives projection optical system PL in the optical axis direction (the Z-axis direction). By the three drive systems 440 provided in the three leg sections 32b, projection optical system PL can be displaced in directions of six degrees of freedom.

On flange FLG of projection optical system PL, an acceleration sensor 234 (not shown in FIG. 1, refer to FIG. 6) used to detect the acceleration of projection optical system PL in directions of six degrees of freedom is arranged, and based on acceleration information detected by acceleration sensor 234, a controller 50 (not shown in FIG. 1, refer to FIG. 6) controls the voice coil motors of drive system 440 so that projection optical system PL is in a static state with respect to column 34 and floor surface F. Incidentally, instead of the acceleration sensor, other sensors such as a vibration sensor, a displacement sensor or the like can be used.

From a lower surface of flange FLG of projection optical system PL, a measurement mount 51 having a ring shape is supported by suspension via a plurality of (in this case, for example, three) support members 53 (however, the support member in the depth of the page surface is not shown). In actuality, the three support members 53 are each configured including a link member, which has a flexure section at its both end portions that can be displaced in directions of five degrees of freedom besides a longitudinal direction of support member 53, and can support measurement mount 51 with little reaction force generated between measurement mount 51 and flange FLG.

On measurement mount 51, a wafer interferometer 58, a wafer alignment system (hereinafter referred to as an alignment system) ALG (not shown in FIG. 1, refer to FIG. 6) serving as a mark detection system, a multipoint focal position detecting system (not shown), and the like are held. As alignment system ALG, an FIA system by an image processing method that is disclosed in, for example, U.S. Pat. No. 5,721,605 and the like can be used. Further, as the multipoint focal position detection system, a multipoint focal position detection system that is disclosed in, for example, U.S. Pat. No. 5,448,332 and the like can be used. Incidentally, when projection optical system PL is mounted on the support member (referred to as a metrology frame and the like) previously described, interferometer 58 or wafer alignment system ALG and the like can be held by the support member, without measurement mount 51 being provided.

Wafer stage WST is supported by levitation above the upper surface of stage surface plate BS that is horizontally placed below projection optical system PL, via an air bearing arranged on the bottom surface of wafer stage WST. In this case, stage surface plate BS is directly installed on floor surface F, and the surface on the +Z side (the upper surface) is processed so that its flatness is extremely high so as to serve as a movement reference surface (a guide surface) of water stage WST. Incidentally, stage surface plate BS can be installed on floor F via a plurality of vibration isolation mechanisms.

Figure 6:
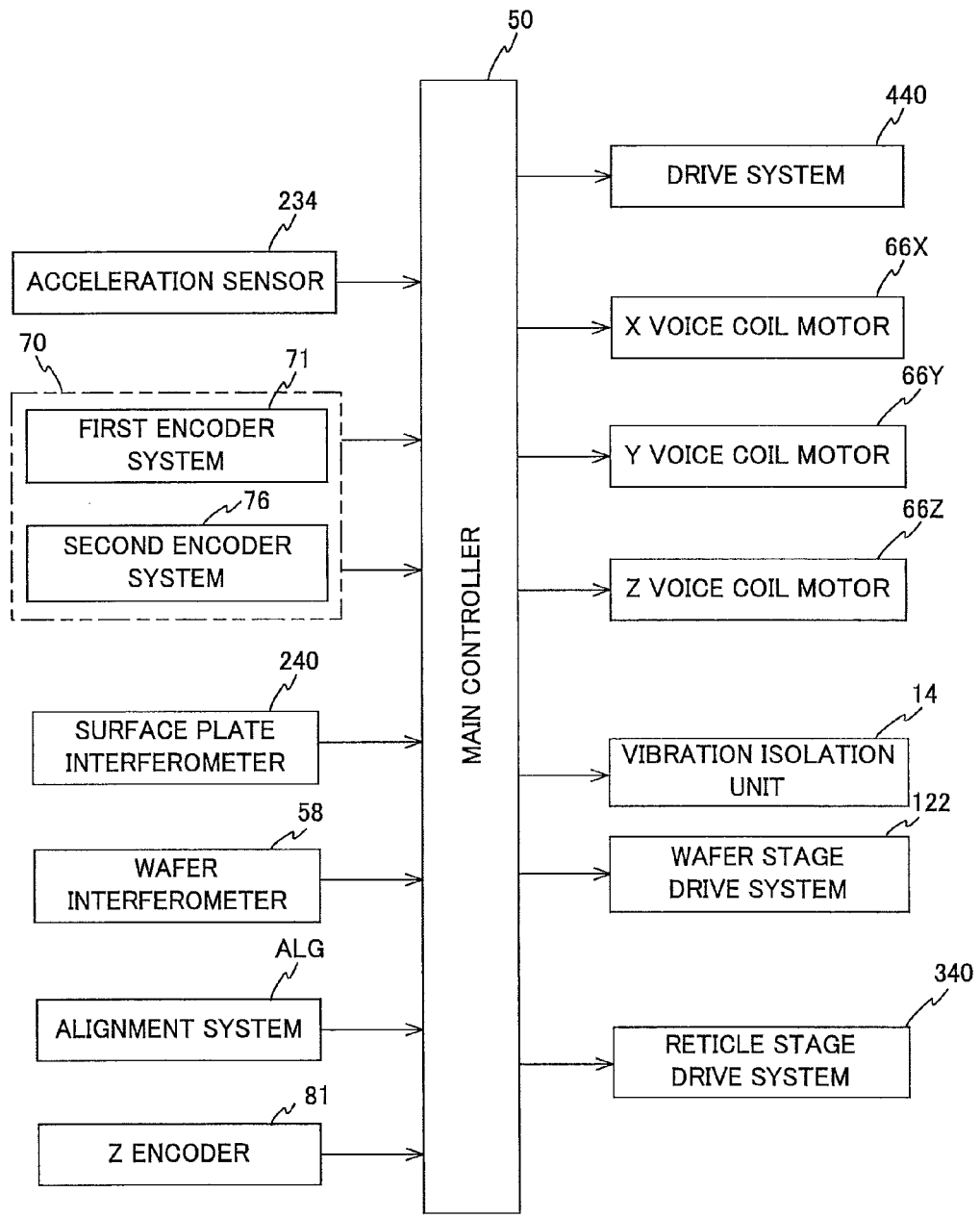
FIG. 6 is a block diagram that shows an input/output relation of a main controller, which centrally configures a control system of the exposure apparatus in FIG. 1.

Wafer stage WST holds wafer W by vacuum suction and the like via wafer holder 125, and can be freely driven within the XY plane along the upper surface of stage surface plate BS by main controller 50 via a wafer stage drive system 122 (not shown in FIG. 1, refer to FIG. 6). Incidentally, for example, a plane motor can be used as wafer stage drive system 122, and in this case, wafer stage WST can be supported by levitation on stage surface plate BS by a magnetic force.

Next, details of reticle stage device 20 and components in the vicinity of the device will be described.

Figure 2:
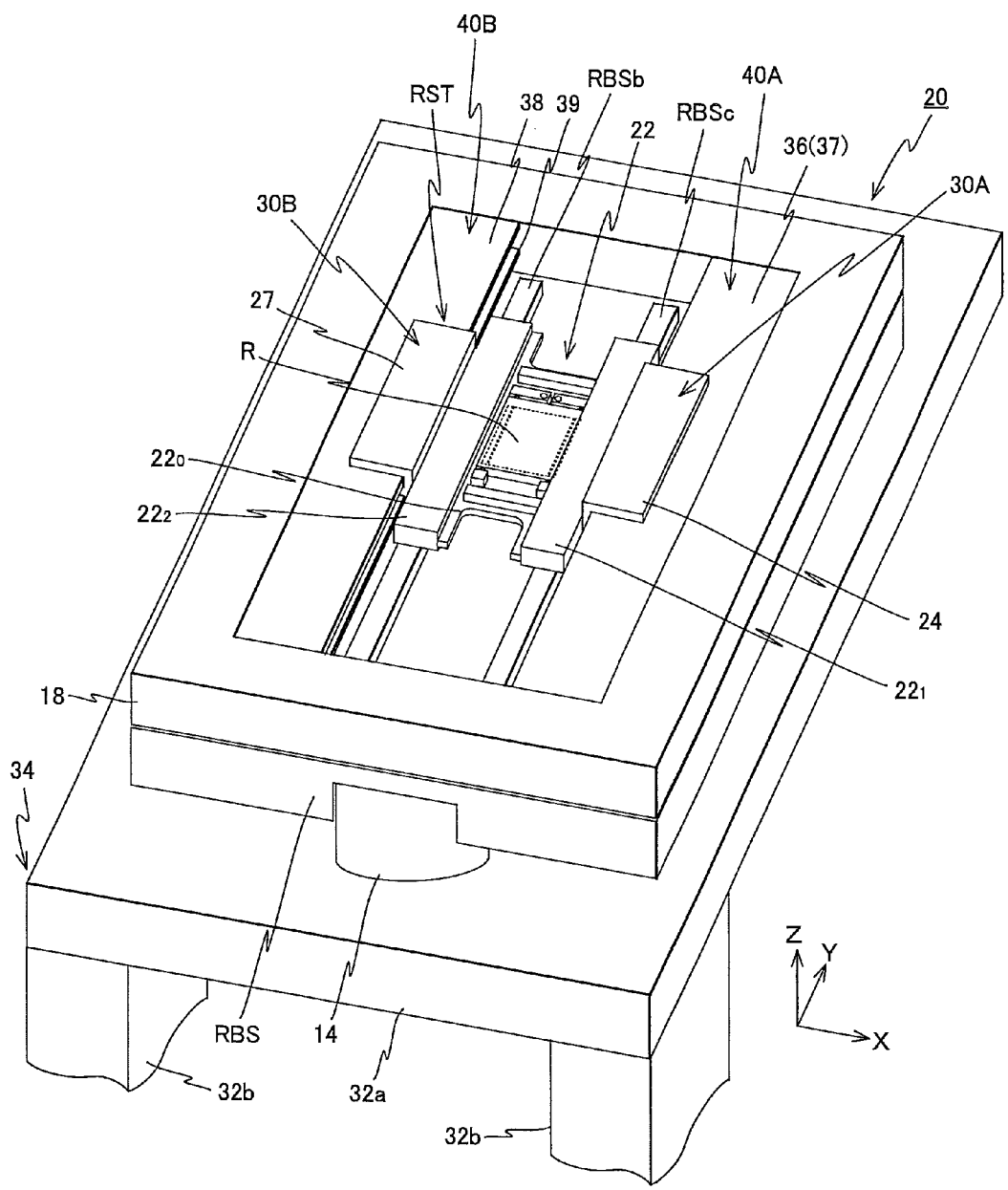
FIG. 2 is a perspective view that shows a reticle stage device.

FIG. 2 shows a perspective view of an outward appearance of reticle stage device 20. Reticle stage surface plate RBS consists of a plate shaped member which is roughly in the shape of a rectangle (in a planar view), and in the center section, an opening RBSa having a rectangular shape in a planar view (when viewed from above) is formed which serves as a path of illumination light IL. Opening RBSa is in a state where it communicates with opening 34a of top board section 32a previously described in Z-axis direction. Further, at positions on the upper surface of reticle stage surface plate RBS distanced equally from the center in the −X direction and in the +X direction, protruding shaped sections RBSb and RBSc (refer to FIG. 3B) are provided extending in the Y-axis direction. The upper surface (the surface on the +Z side) of protruding shaped sections RBSb and RBSc is processed so that its flatness is extremely high, and a guide surface which is used when reticle stage RST moves is formed.

Further, in the vicinity of the outer periphery of the upper surface of reticle stage surface plate RBS, although it is not shown, a plurality of air pads is fixed at a predetermined distance. Counter mass 18 is placed on these plurality of air pads. A part of these plurality of air pads, such as for example, the air pad in the four corners of reticle stage surface plate RBS, support the self-weight of counter mass 18 on the upper surface (the surface on the +Z side) of reticle stage surface plate RBS in a non-contact manner. In the remaining air pads, the balance between the vacuum suction force and the blow-out pressure can be adjusted, and the distance between the lower surface of counter mass 18 and the upper surface of reticle stage surface plate RBS is maintained at a predetermined distance.

The plurality of (for example, three) vibration isolation units shown in FIG. 1 provided between reticle stage surface plate RBS and top board section 32a, each includes a mechanical damper such as an air damper or a hydraulic damper and the like. According to such vibration isolation unit 14, propagation of relatively high frequency vibration to reticle stage RST can be avoided, for example, by the air damper or the hydraulic damper. Further, between reticle stage surface plate RBS and top board section 32a, an X voice coil motor 66X which applies a drive force in the X-axis direction, a Y voice coil motor 66Y which applies a drive force in the Y-axis direction, and a Z voice coil motor 66Z which applies a drive force in the Z-axis direction (none of which are shown in FIG. 2, refer to FIG. 6) are arranged.

As these voice coil motors, for example, at least one of two X voice coil motors 66X and two Y voice coil motors 66Y, and three Z voice coil motors 66Z can be provided. In other words, by providing at least one of two X voice coil motors 66X and two Y voice coil motors 66Y, reticle stage surface plate RBS can be finely driven not only in the X-axis direction and Y-axis direction, but also in the θz direction, and also by providing three Z voice coil motors 66Z, reticle stage surface plate RBS can be finely driven not only in the Z-axis direction, but also in the θx direction and the θy direction. Accordingly, by voice coil motors 66X, 66Y, and 66Z, reticle stage surface plate RBS can be finely driven in directions of six degrees of freedom. Incidentally, the position of reticle stage surface plate is measured by a surface plate interferometer 240 and a Z encoder 81 (both refer to FIG. 6), with projection optical system PL serving as a reference.

In this case, for example, the three Z voice coil motors 66Z are provided at three places that are not collinear between reticle stage surface plate RBS and top board section 32a. As well as these three Z voice coil motor 66Z, a plurality of deformation suppression members (e.g. voice coil motors and the like) may be placed between reticle stage surface plate RBS and top board section 32a. In such an arrangement, when reticle stage surface plate RBS is driven (displaced) only by voice coil motors 66Z in the Z-axis direction, the θx direction, and the θy direction, even in the case when a flexure or a torsion occurs because the point of action of the thrust of Z voice coil motors 66Z is spaced apart, main controller 50 controls the thrust generated in the plurality of deformation variation members (thrust distribution) in response to the thrust generated in the three Z voice coil motors 66Z, which makes it possible to drive (displace) reticle stage surface plate RBS in the Z, the ex, and the θy directions in the state where deformation is suppressed as much as possible.

As shown in FIG. 2, reticle stage RST is equipped with reticle stage main body 22, and a pair of stators 40A and 40B fixed to both ends in the X-axis direction of reticle stage main body 22.

Figure 3A:
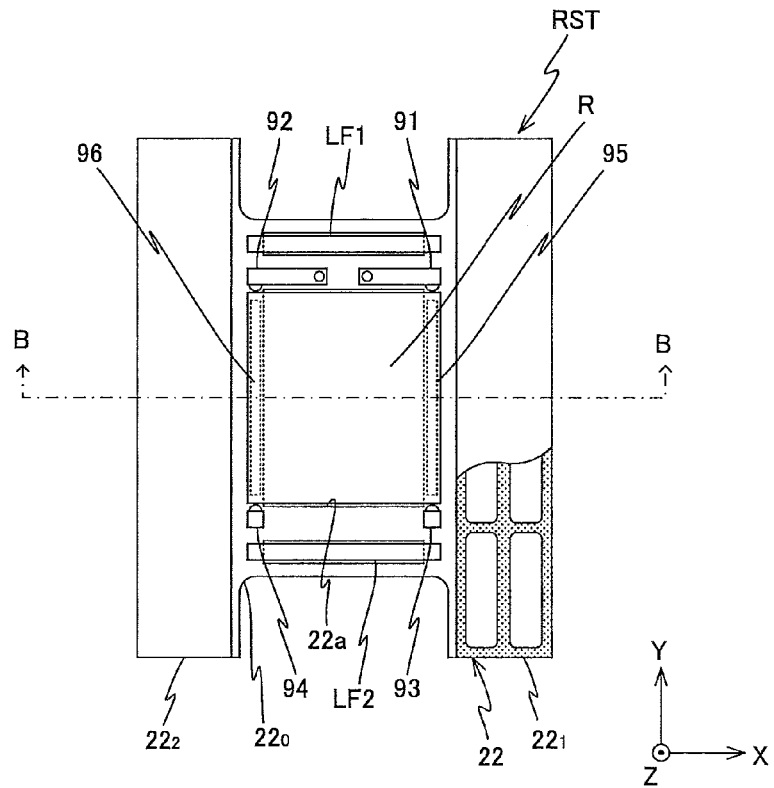
FIG. 3A is a planar view that shows a configuration of a reticle stage.

As shown enlarged in FIG. 3A, reticle stage main body 22 has a rectangular plate shaped section $22_0$, and air slider sections $22_1$ and $22_2$ having a rectangular-parallelepiped shape whose longitudinal direction is in the Y-axis direction and are fixed to the ±X ends of plate shaped section $22_0$, respectively. In this case, in substantially the center of plate shaped section $22_0$, an opening 22a (refer to FIG. 3B) which serves as a path of illumination light IL is formed.

On a both sides in the X-axis direction of opening 22a on the upper surface of plate shape section $22_0$, a pair of vacuum chucks 95 and 96 is placed which suctions and holds the rear surface of reticle R.

Further, on the −Y side of opening 22a on the upper surface of plate shaped section $22_0$, a pair of stoppers (position setting members) 93 and 94 are fixed, placed apart by a predetermined distance (a distance slightly shorter than the width of reticle R in the X-axis direction) in the X-axis direction. These stoppers 93 and 94 push against the edge surface (side surface) on the −Y side of reticle R, and set the position of reticle R.

Further, on the +Y side of opening 22a on the upper surface of plate shaped section $22_0$, clampers (pressing members) 91 and 92 made up of a pair of rotating arms are attached. Clampers 91 and 92 make a set with stoppers 93 and 94, respectively, and each configure a clamping device which clamps reticle R from one side and the other side of the Y-axis direction.

One clamper 91 whose longitudinal direction is in the X-axis direction, is attached pivotably to the plate shaped section $22_0$, with the −X end serving as a supporting point (rotation center). Further, on the +X end of the surface on the −Y side of clamper 91, a protruding section of a substantially hemispherical shape is provided facing stopper 93. And a force is constantly applied to this clamper 91 clockwise by an energizing member made up of a flat spiral spring and the like so that the protruding section presses against the edge surface on the +Y side of reticle R. While the other clamper 92 is symmetric, it is configured similar to clamper 91.

Reticle R is mounted on plate shaped section $22_0$ (reticle stage RST) in a state covering opening 22a from above. Then, reticle R is positioned with the surface on the −Y side of in contact with stoppers 93 and 94, and is fixed by clampers 91 and 92 which apply a predetermined pressing force to the surface on the +Y side. After reticle R is fixed by clampers 91 and 92 and stoppers 93 and 94 in the manner described above, vacuum chucks 95 and 96 suction both ends in the X-axis direction of the lower surface. In the case of unloading reticle R from reticle stage RST, after the suction has been released, clampers 91 and 92 are to be moved away from reticle R against the force which has been applied, and for example, the upper surface (a surface on the opposite side of the patterned surface) of reticle R is to be suctioned from above and lifted, using suction pads and the like. Or, the outside of the pattern area of reticle R is hooked and lifted with hooks and the like. Or reticle R can be lifted once from below with a vertical movement member as is described in a second embodiment to be described later on, and can be handed to a carrier arm from the vertical movement member. Incidentally, instead of the structure where a force is constantly applied to clampers 91 and 92, a structure where the hemispheric protruding section of clampers 91 and 92 can be switched between a first position in contact with reticle R and a second position where reticle R is moved away from reticle R can be employed. Further, as well as a rotating type clamper, a sliding type clamper can also be used.

In addition, on plate shaped section $22_0$, various measurement members are provided. For example, on the ±Y side of opening 22a of plate shaped section $22_0$, rectangular apertures whose longitudinal direction is in the X-axis direction is formed, respectively. In a state where these openings are covered, reticle fiducial mark plates (hereinafter shortly referred to as "reticle mark plates") LF1 and LF2 on which aerial image measurement marks are formed are placed in line with reticle R, and are fixed to plate shaped section $22_0$. Reticle mark plates LF1 and LF2 are made of the same material as reticle R, such as synthetic quarts, fluorite, lithium fluoride or other fluoride crystals. Details on the reticle mark plate are disclosed in, for example, U.S. Patent Application Publication No. 2002/0041377 and the like.

Figure 3B:
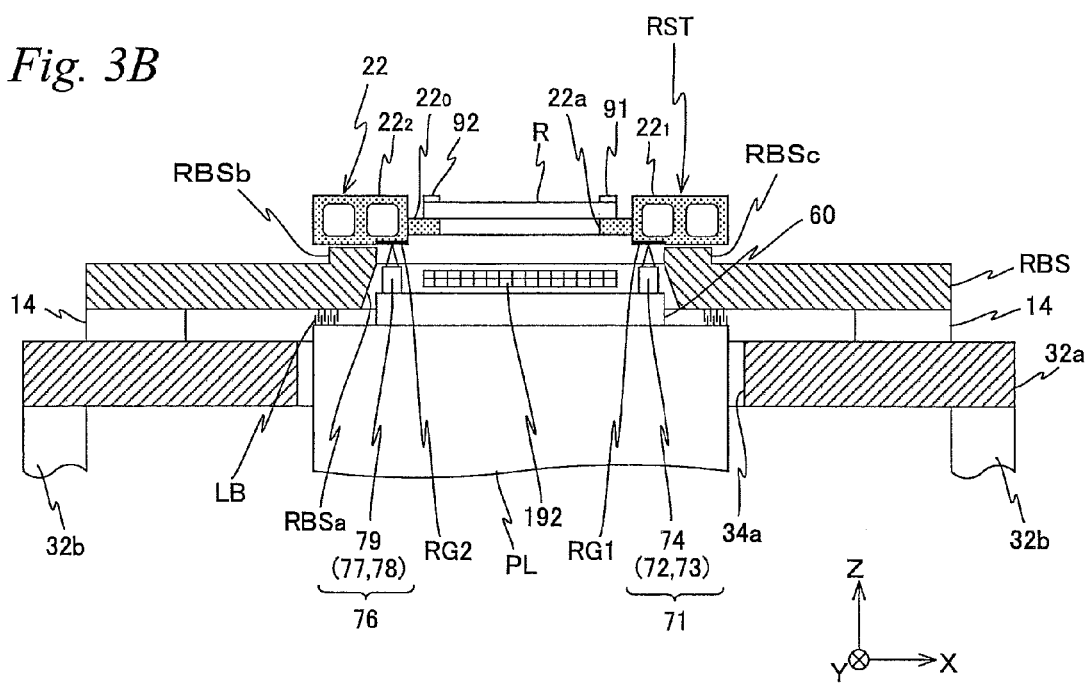
FIG. 3B is a longitudinal sectional view of a reticle stage device sectioned along a line B-B in FIG. 3A.

In the embodiment, as it can be seen from FIG. 3B, reticle R is supported in a state where the patterned surface (lower surface) roughly coincides with a neutral plane (a plane parallel to the XY plane which passes through the centroid of reticle stage main body 22) of reticle stage main body 22 (reticle stage RST).

Air slider sections $22_1$ and $22_2$, as a partially fractured view of the upper surface of air slider section $22_1$ is shown in FIG. 3A, air slider section $22_1$ is made of a hollow member having a grid shaped rib provided inside to maintain its intensity, and to divide its internal space. In other words, air slider sections $22_1$ and $22_2$ are made of rectangular-parallelepiped shape members, which are lightened so that only the rib sections remain so as to attain lighter sections.

On the outer halves in the X-axis direction of the bottom surface of air slider sections $22_1$ and $22_2$, or in other words, on the sections facing protruding shaped sections RBSc and RBSb previously described of reticle stage surface plate RBS, a gas supply groove and a pair of exhaust grooves (none of which are shown) on both sides in the X-axis direction of the gas supply groove are formed covering the entire length in the Y-axis direction. The gas supply groove has a main groove extending in the Y-axis direction, and a plurality of T-shaped surface drawing grooves that are in communication with the main groove on both sides in the X-axis direction and are also formed at a predetermined distance in the Y-axis direction. Facing at least a part of each of the gas supply groove and the pair of exhaust grooves, on reticle stage surface plate RBS, a gas supply opening and a pair of exhaust openings are formed on the upper surface of protruding sections RBSc and RBSb, respectively. As described, in the embodiment, a so called differential exhaust type static gas bearing of a surface plate gas supply type is used. Details on the differential exhaust type static gas bearing of the surface plate gas supply type, are disclosed in, for example, U.S. Pat. No. 7,489,389 and the like.

In this embodiment, reticle stage RST is supported by levitation in a non-contact manner via a clearance (distance/gap) of around several micron above protruding sections RBSc and RBSb, by a balance between a static pressure of pressurized gas supplied from the surface drawing grooves and blows out against the upper surface of protruding sections RBSc and RBSb via the gas supply opening and the self weight of the entire reticle stage RST. In this case, as the pressurized gas, rare gas such as clean dry air (CDA), nitrogen, or helium and the like is used.

A pair of movers 30A and 30B are fixed to a surface on the +X side of air slider section $22_1$ and a surface on the −X side of air slider section $22_2$, respectively, as shown in FIG. 2.

Movers 30A and 30B are each configured by a magnet unit which incorporates a plurality of magnets placed in a predetermined positional relation. Movers 30A and 30B each engage with a pair of stators 40A and 40B, respectively, as shown in FIG. 2.

As shown in FIG. 2, both ends in the longitudinal direction (the Y-axis direction) of one stator 40A is fixed to an inner surface on the +Y side and an inner surface on the −Y side of counter mass 18, and one end (the +X end) in a direction (the X-axis direction) orthogonal to the longitudinal direction is fixed to an inner surface on one side (inner surface on the −X side) of counter mass 18 in the X-axis direction.

Further, both ends in the longitudinal direction (the Y-axis direction) of the other stator 40B is fixed to an inner surface on the +Y side and an inner surface on the −Y side of counter mass 18, and one end (the −X end) in a direction orthogonal to the longitudinal direction is fixed to an inner surface on one side (inner surface on the +X side) of counter mass 18 in the X-axis direction.

In the embodiment, stator 40A, and mover 30A which engages with the stator configure a first XY drive linear motor of a moving magnet type that drives reticle stage RST in the Y-axis direction in predetermined strokes, as well as finely drive reticle stage RST in the X-axis direction. Similarly, stator 40B, and mover 30B which engages with the stator configure a second XY drive linear motor of a moving magnet type that drives reticle stage RST in the Y-axis direction in predetermined strokes, as well as finely drive reticle stage RST in the X-axis direction. And, these first and second XY drive linear motors configure reticle stage drive system 340 (refer to FIG. 6), that drives reticle stage RST in the Y-axis direction by predetermined strokes, as well as finely drive reticle stage RST in the X-axis direction and the θz direction. Further, reticle stage drive system 340 drives a reticle stage within in a neutral plane including the centroid of reticle stage RST. The magnitude and direction of current supplied to each of the coils configuring reticle stage drive system 340 are to be controlled by main controller 50.

Incidentally, in the present embodiment, the reticle stage is not limited to the configuration described above, and for example, the reticle stage can be configured by fixing reticle stage surface plate RBS on top board section 32a (via the vibration isolation unit), and a coarse/fine movement stage moving on reticle stage surface plate RBS. As the coarse/fine movement stage in this case, the stage can be configured by a coarse movement stage which moves in each of the X-axis, the Y-axis, and the θz directions, and a fine movement stage which is placed on the coarse movement stage and can finely move holding reticle R in directions of six degrees of freedom. In this case, position measurement of reticle stage surface plate RBS is no longer required.

Figure 4:
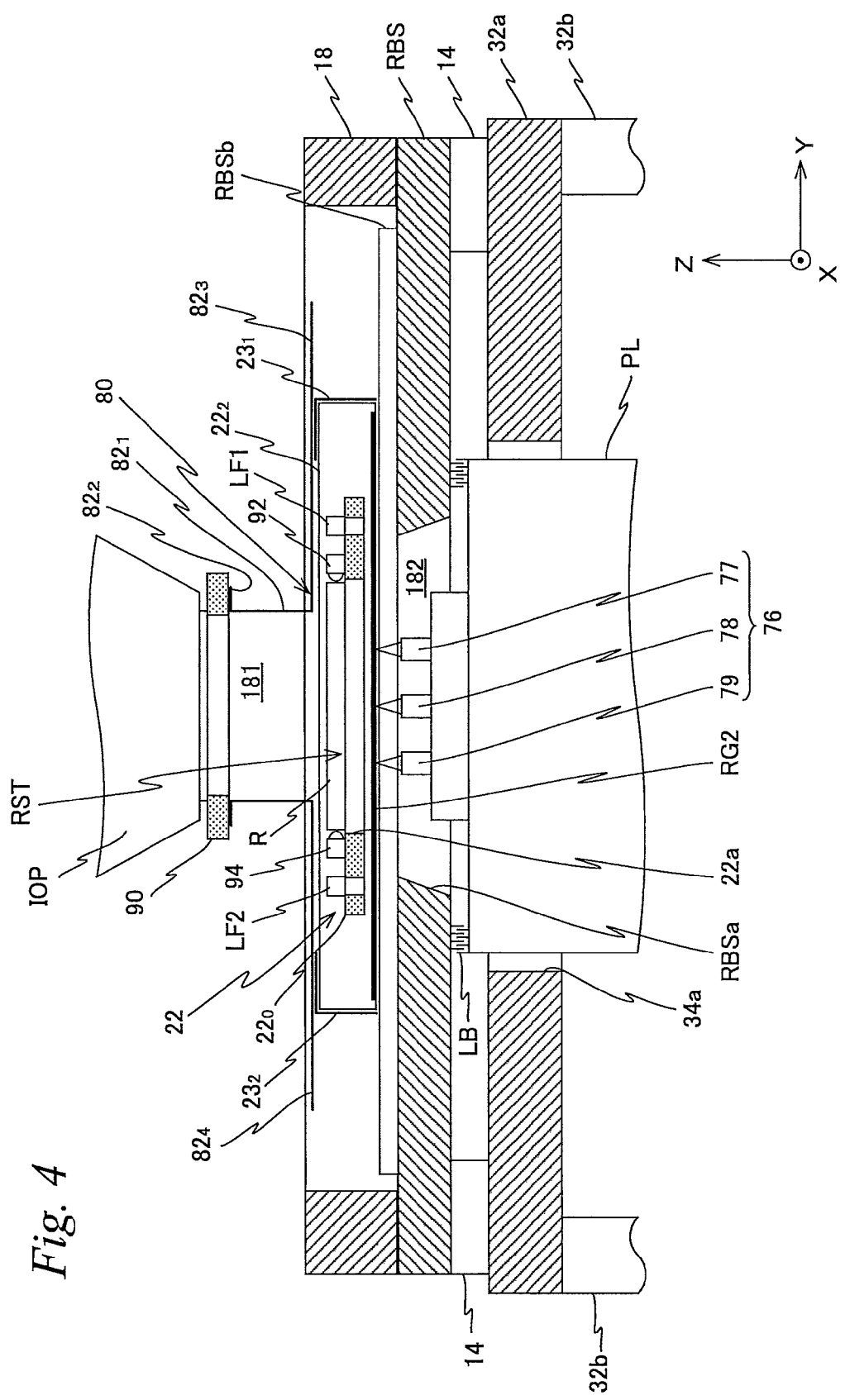
FIG. 4 is a longitudinal sectional view that shows a vicinity of a reticle stage device of the exposure apparatus in FIG. 1.

In the embodiment, as shown in FIG. 4, a purge cover 80 is arranged below a ring shaped fixed member 90 which fixes a light transmitting window member (for example, a glass plate or a lens) located on the lower end (outgoing end) of illumination unit IOP to the housing of illumination unit IOP. Purge cover 80 has a cylindrical portion $82_1$ which has an elongated rectangular shape in the X-axis direction in a planar view, a flange portion $82_2$ provided on the upper end of cylindrical portion $82_1$, and a pair of plate sections $82_3$ and $82_4$ which are provided extending in the +Y direction and the −Y direction, respectively, from the lower end of cylindrical portion $82_1$.

The upper surface of flange portion $82_2$ is fixed to the lower surface of fixed member 90. Cylindrical portion $82_1$ surrounds an irradiation area of illumination light IL emitted from illumination unit IOP. The length of cylindrical portion $82_1$ in the X-axis direction is set slightly shorter than the distance between the outer periphery of air slider sections $22_1$ and $22_2$ of reticle stage RST in the X-axis direction.

Plate section $82_3$ is a plate shaped portion which is parallel to the XY plane extending to the +Y side from the lower end on the +Y side of cylindrical portion $82_1$. The lower surface of plate section $82_3$ is located at a position slightly higher than the upper end surface of reticle stage RST.

Plate section $82_4$ is a plate shaped portion which is parallel to the XY plane extending to the −Y side from the lower end on the −Y side of cylindrical portion $82_1$. The lower surface of this plate section $82_4$ is positioned to be flush with the lower surface of plate section $82_3$.

Further, to the end on the +Y side of reticle stage RST, an end cover $23_1$ is attached which has an L shape when viewed from the side and covers the upper end and the tip of the end on the +Y side. Similarly, to the end on the −Y side of reticle stage RST, an end cover $23_2$ is attached which has an L shape when viewed from the side and covers the upper end and the tip of the end.

In this case, end cover $23_1$ covers the end surface on the +Y side and the upper surface of the +Y end (including the space between air slider sections $22_1$ and $22_2$) of air slider sections $22_1$ and $22_2$, and end cover $23_2$ covers the end surface on the −Y side and the upper surface of the −Y end (including the space between air slider sections $22_1$ and $22_2$) of air slider sections $22_1$ and $22_2$. Therefore, the space on which reticle R is mounted is surrounded all around in every direction by end covers $23_1$ and $23_2$ and air slider sections $22_1$ and $22_2$.

In the embodiment, a predetermined clearance (clearance gap/distance/gap/spatial distance), such as for example, a clearance (clearance gap/distance/gap/spatial distance) from several μm to several mm (3 mm at the greatest) is formed between the lower surface of plate section $82_3$ of purge cover 80 and end cover $23_1$, and between the lower surface of plate section $82_4$ and end cover $23_2$.

The length of plate sections $82_3$ and $82_4$ in the X-axis direction is set to the same level or slightly shorter than the length of cylindrical portion $82_1$ in the X-axis direction. Further, the length in the Y-axis direction of plate section $82_3$ is set so that at least a part of the lower surface of plate section $82_3$ faces end cover $23_1$ within the moving range in the Y axis direction of reticle stage RST at the time of scanning exposure, regardless of its position. Similarly, the length in the Y-axis direction and the setting position of plate section $82_4$ is set so that at least a part of the lower surface of plate section $82_4$ faces end cover $23_2$ within the moving range in the Y axis direction of reticle stage RST at the time of scanning exposure, regardless of its position.

In the manner described above, in the present embodiment, a space 181 of a substantially airtight state is formed by purge cover 80, end covers $23_1$ and $23_2$, air slider sections $22_1$ and $22_2$, and reticle R. In this space 181, for example, clean dry air (CDA) is supplied as the purge gas from a supply opening (not shown), and is exhausted outside via an exhaust opening. In other words, internal gas (air) of space 181 is purged with CDA. The ratio of moisture which is a substance accelerating the reaction of haze generation on a reticle (mask) included in CDA is extremely small when compared with the case of normal air, and in the embodiment, for example, the humidity is around 1% or less. Space 181 becomes a purge chamber which is in a substantially airtight state. Hereinafter, this space will be referred to as a first purge space 181. In this case, the first purge space 181 is in an airtight state where the control accuracy of the humidity inside can be maintained to a predetermined level, such as for example, the humidity being maintained to around 2% in the case the inside is purged with CDA having a humidity of 1%. Further, the first purge space 181 is in an airtight state where fog generation of the optical members such as the lens of the illumination unit in contact with space 181 resulting from the presence of moisture can be suppressed, such as for example, an airtight state where the fog generation is suppressed to a level so that exposure can be carried out without any problems.

Further, reticle stage surface plate RBS and projection optical system PL are sealed together, for example, via a labyrinth seal LB, which is a type of a non-contact seal as shown in FIG. 3B. Labyrinth seal LB shown in FIG. 3B is set between reticle stage surface plate RBS and projection optical system PL, in a state surrounding the periphery of opening RBSa. In this case, labyrinth seal LB has a loop shaped upper member whose upper end is fixed to the lower surface of reticle stage surface plate RBS in a state surrounding the periphery of opening RBSa, and a lower member which engages with the upper member in a non-contact manner and whose lower surface is fixed to the upper surface of projection optical system PL in a state surrounding an upper surface member 60. The upper member has multiple projection portions which are concentric when viewed from the −Z direction, and the lower member has multiple projection portions which are positioned slightly outside of the upper member, engage with the upper member in a non-contact manner, and are concentric when viewed from the +Z direction. However, the two projection portions engage with each other constantly in a non-contact manner, without being in contact, even if reticle stage surface plate RBS is finely driven.

Therefore, in the embodiment, as shown in FIG. 3B, a space 182 of a substantially airtight state is formed, divided by reticle R and reticle main body 22, the inner wall surface of the opening of reticle stage surface plate RBS, the upper surface of projection optical system PL, and labyrinth seal LB. CDA is supplied from an air outlet 192 provided in a part of the inner wall surface of the opening of reticle stage surface plate RBS inside such space 182, and is exhausted outside via an exhaust opening (not shown). In other words, internal gas (air) of space 182 is purged with CDA. Space 182 becomes a purge chamber which is in a substantially airtight state. Hereinafter, this space will be referred to as a second purge space 182. The second purge space 182 is also set to the same level of airtight state as the first purge space 181 previously described.

On the bottom surface of air slider sections $22_1$ and $22_2$, gratings RG1 and RG2 are arranged (refer to FIG. 5), respectively, covering almost the entire length extending in the Y-axis direction as shown in FIG. 3B. On each of the surfaces of gratings RG1 and RG2, a two-dimensional grating is formed whose periodic direction is in the X-axis direction and a Y axial direction.

Figure 5:
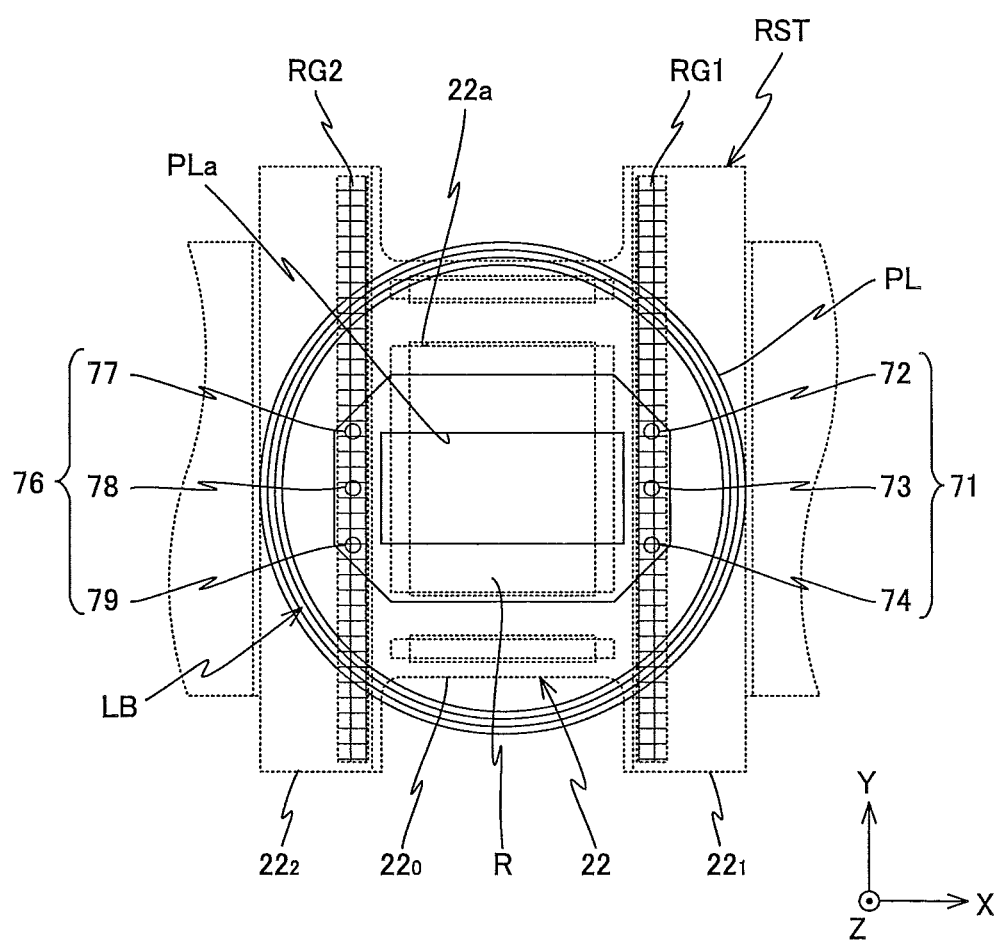
FIG. 5 is a view used to explain a configuration of a reticle encoder system.

To the top surface of projection optical system PL, upper surface member 60 of a hexagonal shape in a planar view as shown in FIG. 5 in which a rectangular opening PLa is formed in the center is fixed (refer to FIG. 3B). Opening PLa is an optical path (passage) of illumination light IL which transmits the pattern surface of reticle R, and has transmit opening RBSa of reticle stage surface plate RBS. On both ends (both sides of opening PLa) in the X-axis direction on the upper surface of upper surface member 60, three each of the encoder heads 72, 73, and 74, and 77, 78, and 79 are fixed. Encoder heads 72 and 77 are placed in the vicinity of the corner on the +Y side of opening PLa, encoder heads 74 and 79 are placed in the vicinity of the corner on the −Y side, and encoder heads 73 and 78 are placed at the same Y position as the center (in other words, the optic axis of projection optical system PL) of opening PLa.

Three each of the encoder heads 72, 73, and 74, and 77, 78, and 79 face gratings RG1 and RG2 previously described, respectively.

In the embodiment, as encoder heads 72 to 74 and 77 to 79, a two-dimensional encoder head is employed whose measurement direction is in two directions which are one direction (one period direction of the grating) parallel to the grating (measurement plane) and a direction perpendicular to the measurement plane. An example of such a head is disclosed in, for example, U.S. Pat. No. 7,561,280 and the like.

Here, the Y-axis direction and the Z-axis direction serve as the measurement directions of the four encoder heads 72, 74, 77, and 79, and the X-axis direction and Z-axis direction serve as the measurement directions of the two encoder heads 73 and 78.

As shown in FIG. 3B, encoder heads 72, 73, and 74 irradiate measurement beams on grating RG1 from below on the bottom surface of reticle stage RST (air slider section $22_1$) via opening RBSa of reticle stage surface plate RBS, receive a plurality of diffraction lights generated in grating RG1, and obtain (measure) positional information of grating RG1 (that is, air slider section $22_1$ of reticle stage RST) in each of the measurement directions.

In this case, because both directions, which are the X-axis direction and the Y-axis direction serve as the periodic direction of gratings RG1 and RG2, by irradiating a coherent measurement beam (making the measurement beam enter), the diffraction lights are generated in both the X-axis direction and the Y-axis direction at a plurality of angles (diffraction angles). Therefore, encoder heads 72 and 74 receive the plurality of diffraction lights generated in the Y-axis direction, and with the irradiation point of each of the measurement beams serving as a measurement point, obtain (measure) the positional information of grating RG1 (in other words, air slider section $22_1$ of reticle stage RST) in the Y-axis direction and the Z-axis direction.

Encoder head 73 receives the plurality of diffraction lights generated in the X-axis direction, and with the irradiation point of the measurement beam serving as a measurement point, obtains (measures) the positional information of grating RG1 (in other words, air slider section $22_1$ of reticle stage RST) in the X-axis direction and the Z-axis direction.

Encoder heads 72, 73, and 74 configure a first encoder system 71 (refer to FIG. 6) whose measurement degree of freedom is in six degrees, which obtains (measures) the positional information of reticle stage RST in the X-axis direction, the Y-axis direction, and the Z-axis direction. Measurement information of the first encoder system 71 (encoder heads 72, 73, and 74) is sent to main controller 50 (refer to FIG. 6).

Similar to encoder heads 72, 73, and 74 described above, encoder heads 77, 78, and 79 irradiate measurement beams on grating RG2 from below on the bottom surface of reticle stage RST (air slider section $22_2$) via opening RBSa of reticle stage surface plate RBS, receive a plurality of diffraction lights generated in grating RG2, and obtain (measure) positional information of grating RG2 (air slider section $22_2$ of reticle stage RST) in each of the measurement directions.

Now, encoder heads 77 and 79 receive the plurality of diffraction lights generated in the Y-axis direction, and with the irradiation point of each of the measurement beams serving as a measurement point, obtain (measure) the positional information of grating RG2 (in other words, air slider section $22_2$ of reticle stage RST) in the Y-axis direction and the Z-axis direction. Encoder head 78 receives the plurality of diffraction lights generated in the X-axis direction, and with the irradiation point of the measurement beam serving as a measurement point, obtains (measures) the positional information of grating RG2 (in other words, air slider section $22_2$ of reticle stage RST) in the X-axis direction and the Z-axis direction.

Encoder heads 77, 78, and 79 configure a second encoder system 76 (refer to FIG. 6) whose measurement degree of freedom is in six degrees, which obtains (measures) the positional information of reticle stage RST in the X-axis direction, the Y-axis direction, and the Z-axis direction. Measurement information of the second encoder system 76 (encoder heads 77, 78, and 79) is sent to main controller 50 (refer to FIG. 6).

Main controller 50 obtains (computes) the positional information in directions of six degrees of freedom of reticle stage RST, with the center (optical axis) of projection optical system PL serving as a reference, based on the measurement information of the first and second encoder systems 71 and 76 (encoder heads 72 to 74, and 77 to 79). Reticle encoder system 70 is configured (refer to FIG. 6) including the first and the second encoder systems 71 and 76.

Now, because reticle encoder system 70 of the embodiment comprises six two-dimensional encoder heads, a total of twelve measurement information can be obtained. Therefore, main controller 50, for example, obtains a Y position ($Y_1$) of air slider section $22_1$ of reticle stage RST by an average of the measurement values of the position in the Y-axis direction measured by encoder heads 72 and 74, and obtains an X position ($X_1$) of air slider section $22_1$ of reticle stage RST from the measurement values of the position in the X-axis direction measured by encoder head 73. Similarly, main controller 50, obtains a Y position ($Y_2$) of air slider section $22_2$ of reticle stage RST by an average of the measurement values of the position in the Y-axis direction measured by encoder heads 77 and 79, and obtains an X position ($X_2$) of air slider section $22_2$ of reticle stage RST from the measurement values of the position in the X-axis direction measured by encoder head 78. Furthermore, by the average and difference of $Y_1$ and $Y_2$, main controller 50 obtains a Y position and a $\theta z$ position (rotational amount in the $\theta z$ direction, that is, yawing amount) of reticle stage RST, respectively, and obtains an X position of reticle stage RST from the average of $X_1$ and $X_2$.

Further, by the average and difference of the measurement values of the position in the Z-axis direction measured by encoder heads 73 and 78, main controller 50 obtains a Z position and a $\theta y$ position (rotational amount in the $\theta y$ direction, that is, rolling amount). Further, the $\theta x$ position ($\theta x_1(\theta x_2)$) of air slider sections $22_1$ and $22_2$ is obtained from the difference between the measurement values of the position in the Z-axis direction measured by each of the encoder heads 72 and 74, and 77 and 79, and the $\theta x$ position (rotational amount in the $\theta x$ direction, that is, pitching amount) of reticle stage RST is obtained from the average of $\theta x_1$ and $\theta x_2$. In this case, the X, Y, and $\theta x$ positions of reticle stage RST can be obtained without averaging the two measurement values in each direction as is described above measured by encoder system 70, and either of the measurement values can be used without modification.

Based on the positional information in directions of six degrees of freedom of reticle stage RST obtained in the manner described above, main controller 50 drives (controls the position of) reticle stage RST via reticle stage drive system 340 previously described.

FIG. 6 shows a block diagram showing an input/output relation of main controller 50, which centrally configures a control system of exposure apparatus 100 of the embodiment. Main controller 50 includes a so-called microcomputer (or workstation) consisting of a CPU (Central Processing Unit), ROM (Read Only Memory), RAM (Random Access Memory) and the like, and has overall control over the entire apparatus.

A flow of an exposure operation according to exposure apparatus 100 configured in the manner described above will now be briefly described.

First of all, under the control of main controller 50, loading of reticle R by a reticle loader (not shown) on reticle stage RST and loading of wafer W by a wafer loader (not shown) on wafer stage WST are performed, and also using alignment system ALG (refer to FIG. 6) and a reticle alignment system (not shown) and the like, preparatory operations such as reticle alignment, baseline measurement of alignment system ALG and the like are performed according to a predetermined procedure like the one disclosed in, for example, U.S. Pat. No. 5,646,413 and the like. Incidentally, reticle alignment can be performed, using an aerial image measuring instrument (not shown) provided on wafer stage WST, instead of the reticle alignment system.

Then, main controller 50 performs wafer alignment such as EGA (enhanced global alignment) disclosed in, for example, U.S. Pat. No. 4,780,617 and the like, using alignment system ALG, and after the wafer alignment has been completed, an exposure operation by the step-and-scan method is performed. Because this exposure operation is similar to the conventional step-and-scan method, the explanation thereabout is omitted.

On this exposure operation, while wafer stage WST and reticle stage RST are relatively driven in the Y-axis direction under the control of main controller 50, on the drive, main controller 50 controls reticle stage drive system 340 and drives reticle stage RST, based on the measurement results of reticle encoder system 70. On this drive, while reticle stage RST reciprocally moves within a predetermined range with the illumination area in between in the Y-axis direction, by this movement, the airtight state is maintained in purge space 181, as well as in purge space 182, and the CDA purge is effectively performed.

Further, along with controlling X voice coil motor 66X and Y voice coil motor 66Y described above based on the measurement results of surface plate interferometer 240 so that reticle stage surface plate RBS maintains a predetermined state, main controller 50 also controls Z voice coil motor 66Z based on the measurement results of Z encoder 81, and by adjusting the position of reticle stage surface plate RBS in the Z direction, and the θx and the θy directions, indirectly adjusts the position of reticle R in the Z direction, and the θx and the θy directions.

As described above, exposure apparatus 100 of the embodiment is equipped with a purge cover 80 that has a pair of plate sections $82_3$ and $82_4$ which are placed apart in the scanning direction (the Y axis direction) of reticle stage RST, having one end connected to illumination unit IOP and the other end facing reticle stage RST and a surface (upper surface) on the +Z side (the side of illumination unit IOP) of reticle R, or to be more precise, facing the upper surface of end covers $23_1$ and $23_2$ via a clearance (clearance gap/distance/gap/spatial distance) of around several μm to several mm. Therefore, between reticle stage RST and the pair of plate sections $82_3$ and $82_4$, a minute clearance (clearance gap/distance/gap/spatial distance) is set which substantially blocks the gaseous circulation. Therefore, in the embodiment, space 181 of a substantially air tight state is formed which includes an optical path of illumination light IL between illumination unit IOP and projection optical system PL surrounded by purge cover 80 and reticle stage RST and/reticle R. Accordingly, by making this space 181 a purge space where it is purged, for example, with CDA, it no longer becomes necessary to surround reticle stage device 20 holding reticle R with a large air-tight shielding container. Further, because the space described above which is almost airtight is to be the space purged with CDA, haze of the mask can be effectively prevented. Furthermore, because purge cover 80 also serves as a partition wall which isolates purge space 181 from the outside air, the space where purge is performed can be secured without increasing the size of the device more than necessary.

Further, because haze of reticle R can be effectively prevented, it becomes possible to stop the generation of pattern defects and variation of CD (Critical Dimension) beforehand which occur due to haze that has grown on the reticle being transferred onto the wafer. Further, because it is not necessary to perform inspection on the reticle frequently to prevent such defects, as a consequence, productivity can be kept from decreasing, which in turn makes it possible to improve the productivity.

A Second Embodiment

Next, a second embodiment of the present invention will be described, with reference to FIGS. 7 to 9. Here, the same reference numerals will be used for the same or similar sections as in the first embodiment previously described, and a detailed description thereabout will be simplified or omitted.

Figure 7:
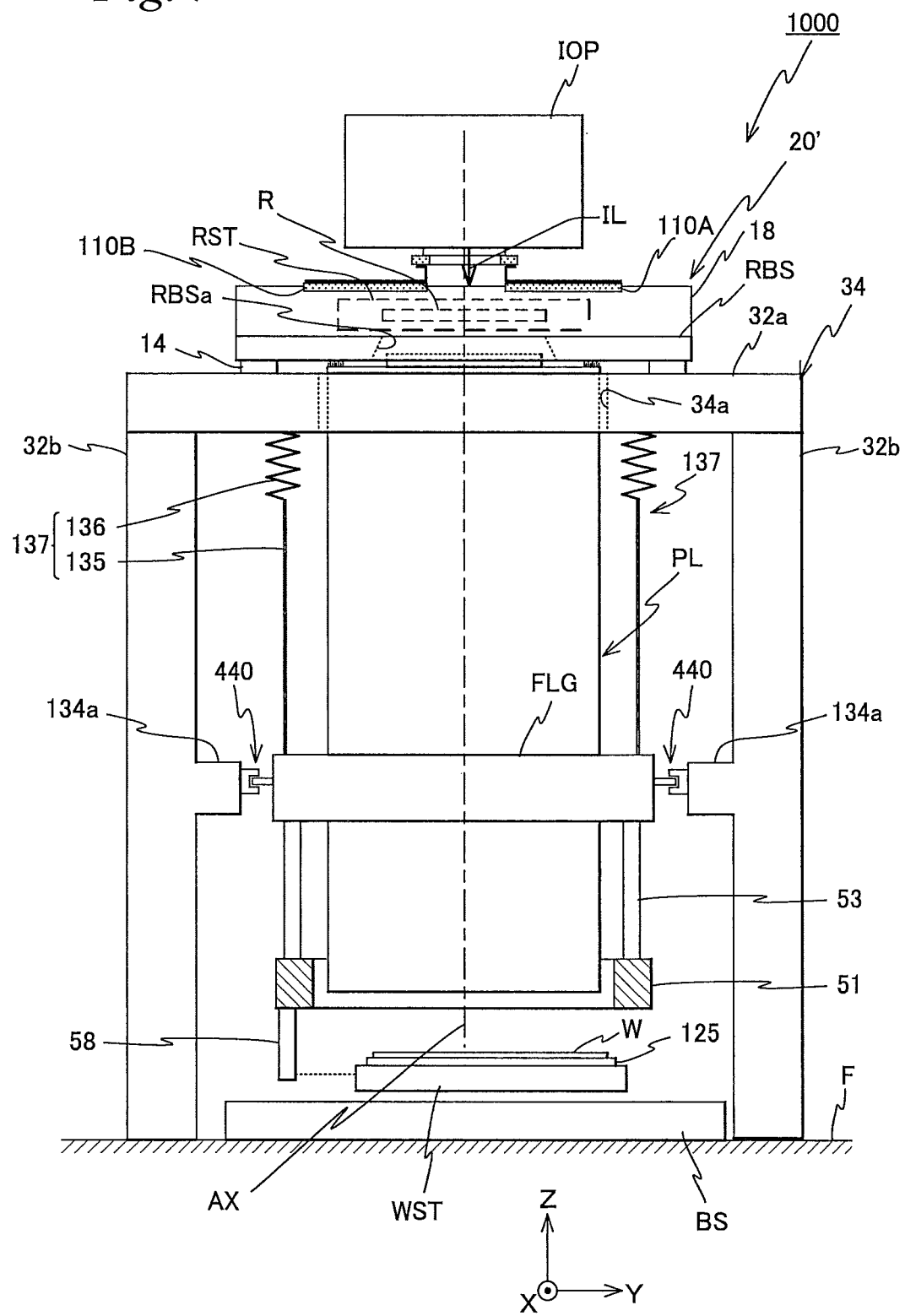
FIG. 7 is a schematic view that shows an exposure apparatus of a second embodiment.

FIG. 7 schematically shows a configuration of an exposure apparatus 1000 in the second embodiment. Further, FIG. 9 shows a block diagram showing an input/output relation of main controller 50, which centrally configures a control system of exposure apparatus 1000 of the second embodiment.

As is obvious when comparing FIGS. 1 and 7, exposure apparatus 1000 of the second embodiment is basically configured similar to exposure apparatus 100 of the first embodiment previously described, but is different from exposure apparatus 100 of the first embodiment on the point that instead of reticle stage device 20, exposure apparatus 1000 is equipped with a reticle stage device 20'. Reticle stage device 20' differs from reticle stage device 20 on the point that reticle stage device 20' is equipped with a pair of proximity cooling devices 110A and 110B.

The description below includes such proximity cooling devices 110A and 110B, and the description will be made, focusing mainly on the difference with the first embodiment previously described.

Figure 8:
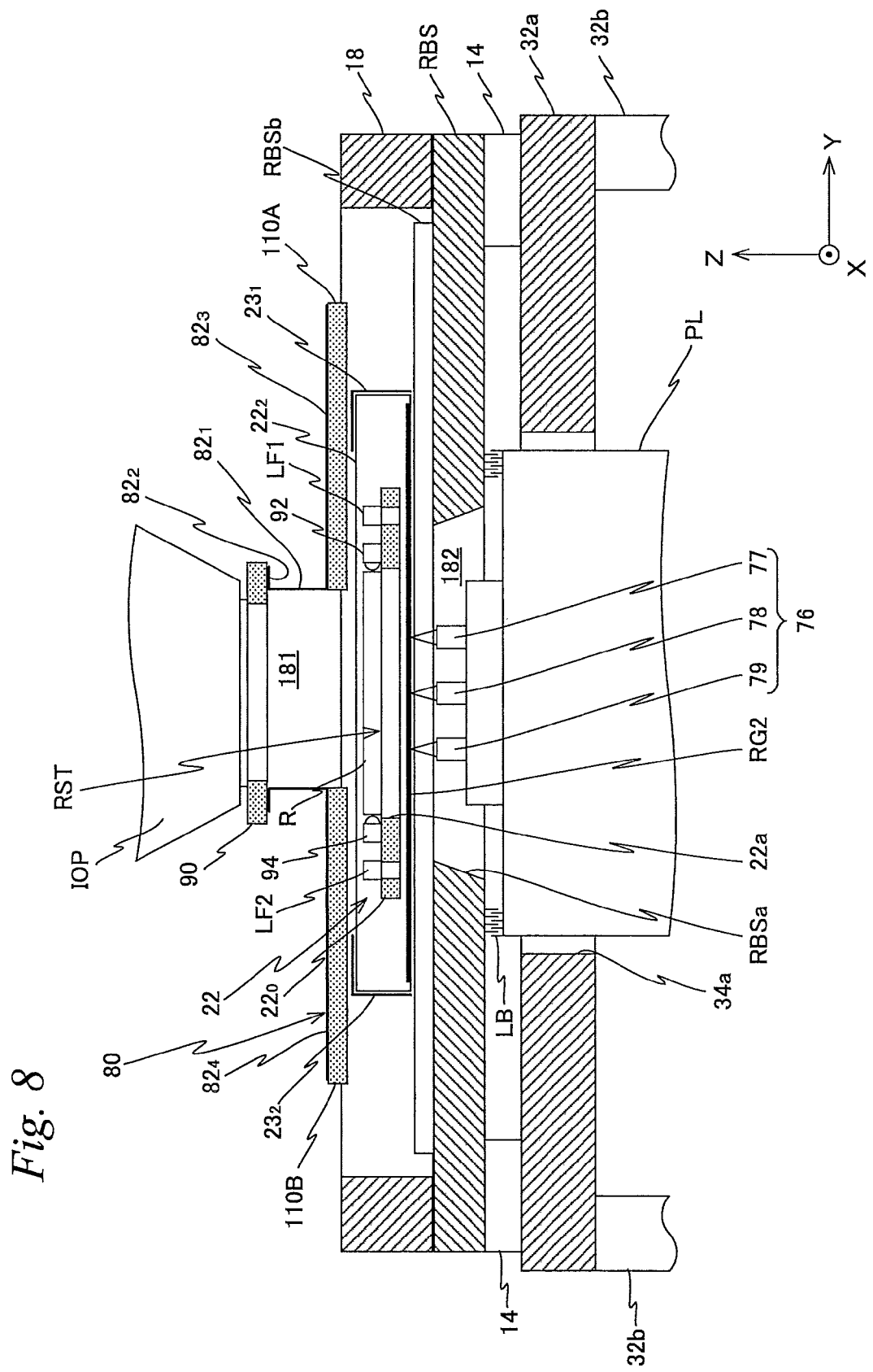
FIG. 8 is a longitudinal sectional view that shows a vicinity of a reticle stage device of the exposure apparatus in FIG. 7.
Figure 9:
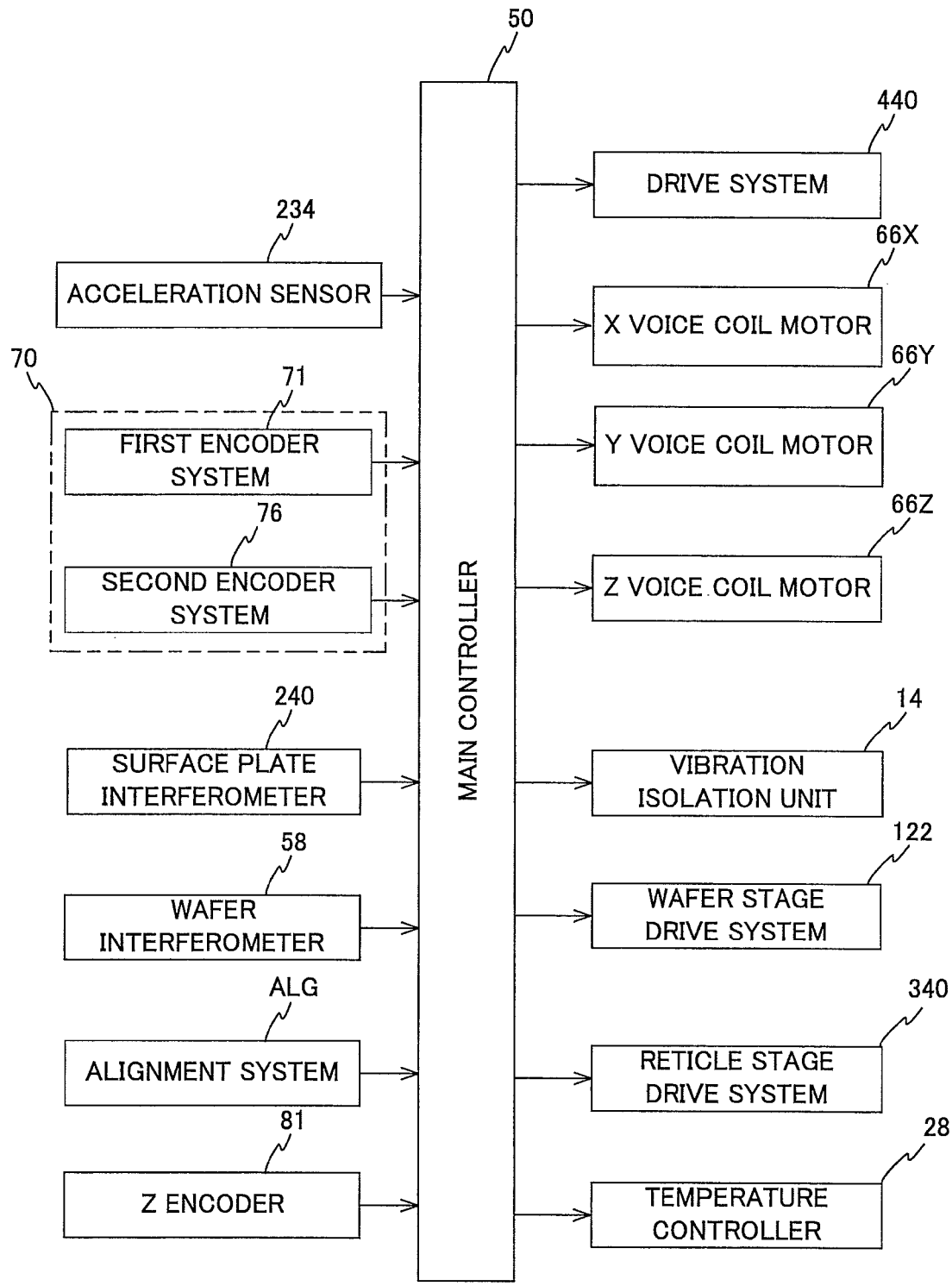
FIG. 9 is a block diagram that shows an input/output relation of a main controller, which centrally configures a control system of the exposure apparatus in FIG. 7.

Proximity cooling devices 110A and 110B have a shape of a thin plate, and one of the proximity cooling devices 110A is fixed to the lower surface of plate section $82_3$ of purge cover 80 configured in a similar manner as the purge cover of the first embodiment, as shown in FIG. 8. The lower surface of this proximity cooling device 110A is located at a position slightly higher than the upper end surface of reticle stage RST.

The other proximity cooling device 110B is fixed to the lower surface of plate section $82_4$ of purge cover 80. The lower surface of proximity cooling device 110B is positioned to be flush with the lower surface of proximity cooling device 110A.

In the second embodiment, a predetermined clearance (clearance gap/distance/gap/spatial distance), such as, for example, a clearance (clearance gap/distance/gap/spatial distance) of several μm to several mm (3 mm at the greatest) is formed between the lower surface of proximity cooling device 110A and end cover $23_1$, and the lower surface of proximity cooling device 110B and end cover $23_2$, respectively.

The length of proximity cooling devices 110A and 110B in the X-axis direction is set to substantially the same length as plate sections $82_3$ and $82_4$, or in other words, is set to the same level or slightly shorter than the length of cylindrical portion $82_1$ in the X-axis direction. Further, the length of proximity cooling devices 110A and 110B in the Y-axis direction is substantially the same length as plate sections $82_3$ and $82_4$ in the embodiment. However, the length of proximity cooling devices 110A and 110B in the Y-axis direction does not have to be substantially the same length as plate sections $82_3$ and $82_4$. The length in the Y-axis direction of proximity cooling device 110A is set so that at least a part of the lower surface of proximity cooling device 110A faces end cover $23_1$ within the moving range in the Y-axis direction of reticle stage RST during scanning exposure regardless of its position. Similarly, the length in the Y-axis direction and the setting position of proximity cooling device 110B is set so that at least a part of the lower surface of proximity cooling device 110B faces end cover $23_2$ within the moving range in the Y-axis direction of reticle stage RST during scanning exposure regardless of its position. As it can be seen from FIG. 8, the cooling area by proximity cooling devices 110A and 110B is set to one side and the other side in the Y-axis direction with the irradiation area of illumination light IL emitted from illumination unit IOP in between.

In the present embodiment, a space 181 of a substantially airtight state, or in other words, a purge chamber of a substantially airtight state, is formed by purge cover 80, proximity cooling devices 110A and 110B, end covers 23$_1$ and 23$_2$, air slider sections 22$_1$ and 22$_2$, and reticle R. The inside of the first purge space 181 is purged, for example, with clean dry air (CDA) whose humidity is 1% or less.

Proximity cooling devices 110A and 110B are to be cooled by a heat exchange with a coolant which passes through a cooling piping (not shown). The temperature of proximity cooling devices 110A and 110B are monitored by a temperature sensor (not shown), and the temperature signals are sent to temperature controller 28 (refer to FIG. 9), and is controlled to a target value as it will be described later on. The temperature control of proximity cooling devices 110A and 110B can be achieved by changing the temperature of the coolant, or the temperature control can also be achieved by installing a semiconductor Peltier element (not shown) between proximity cooling devices 110A and 110B and the coolant, and controlling the current supplied to the Peltier element so that a heat transmission amount is actively controlled. In the latter case, there is the advantage that the response of temperature control of proximity cooling devices 110A and 110B become quicker.

The configuration for other sections in exposure apparatus 1000 of the second embodiment is the same as exposure apparatus 100 of the first embodiment previously described.

In exposure apparatus 1000 of the second embodiment, wafer alignment such as EGA and the like is performed after preparatory operations such as loading of reticle R onto reticle stage RST, loading of wafer W onto wafer stage WST, reticle alignment, baseline measurement of alignment system ALG and the like are performed, and after the wafer alignment has been completed, the exposure operation by the step-and-scan method is performed by main controller 50, as in the first embodiment previously described.

On this exposure operation, while wafer stage WST and reticle stage RST are relatively driven in the Y-axis direction under the control of main controller 50, on the drive, main controller 50 controls reticle stage drive system 340 and drives reticle stage RST, based on the measurement results of reticle encoder system 70. On this drive, while reticle stage RST reciprocally moves in the predetermined range (a range in which the reticle stage can face almost the entire surface of proximity cooling devices 110A and 110B) in the Y-axis direction with the illumination area in between, by this movement, the airtight state is maintained in purge space 181, as well as in purge space 182, and the CDA purge is effectively performed. Further, during the reciprocal movement in the Y-axis direction of reticle stage RST, temperature control device controller 28 effectively cools reticle R and reticle stage RST via the pair of proximity cooling devices 110A and 110B provided away in the Y-axis direction.

In this case, in the second embodiment, proximity cooling devices 110A and 110B performs cooling of reticle R and reticle stage RST in a non-contact manner. In other words, cooling is performed by a radiative heat transfer.

Radiative heat transfer will now briefly be described.

For example, when reticle R is placed opposite to a proximity cooling device, heat transfer is performed by radiation from a high-temperature substance side to a low-temperature substance side of reticle R and the proximity cooling device, according to the temperature difference of both substances. Accordingly, when reticle R is to be cooled, the temperature of the proximity cooling device should be set lower than the temperature of reticle R. In practice, because the quantity of radiative heat transfer from a high-temperature substance A to a low temperature substance B is decided (refer to, for example, Holeman, J. P, "Heat Transfer" (McGraw-Hill Book Company/Brain Toshyo) for details) according to formula (1) below, main controller 50 can control the temperature of the proximity cooling device via temperature controller 28, based on formula (1) so that reticle R becomes a desired temperature.

$$q = \frac{\sigma(TA^4 - TB^4)}{(1-\varepsilon_A)/\varepsilon_A/S_A + 1/F_{AB}/S_A + (1-\varepsilon_B)/\varepsilon_B/S_B} \quad (1)$$

In this formula,
q: quantity of radiative heat transfer from substance A to substance B
σ: Boltzmann constant
TA: absolute temperature of substance A
TB: absolute temperature of substance B
εA: emissivity of object A
εB: emissivity of object B
SA: surface area of object A
SB: surface area of the object B
FAB: geometric factor from substance A to substance B While the geometric factor in formula (1) above is a number equal to or less than 1, in the case of heat transfer between rectangular shaped plates such as in the embodiment, the larger the proportion of the length of a side of the rectangle is with respect to the distance between the plates, the more the value of the geometric factor becomes closer to 1. In the scanning exposure apparatus, because in many cases the illumination area of reticle R is in a slit shape as in the embodiment, when proximity cooling devices 110A and 110B are placed considerably near reticle R on reticle R as shown in FIG. 8, proximity cooling devices 110A and 110B can be made constantly relative up to around two-thirds of the entire area of reticle R, regardless of the position of reticle stage RST within the scanning range. Accordingly, the geometric factor can easily be made to be a value of around 0.2.

Main controller 50 calculates an exposure ratio (duty ratio of an on/off of irradiation (pulse)) based on illuminance signals from the power monitor (integrator sensor) previously described, and computes an exposure energy based on the calculation results and a known illuminance and data such as a pattern opening ratio of reticle R, reflectivity and the like, and predicts heat quantity Q given to reticle R based on the computation results. Then, main controller 50 decides a temperature target value of proximity cooling devices 110A and 110B using the formula referred to earlier, so that heat quantity Q coincides with a heat quantity q given to proximity cooling devices 110A and 110B from reticle R at the time of radiational cooling, and conveys a command value to temperature controller 28. This allows temperature controller 28 to control the temperature of proximity cooling devices 110A and 110B, which allows the temperature of reticle R to be adjusted within a predetermined range.

As described so far, exposure apparatus 1000 of the second embodiment is equipped with proximity cooling devices 110A and 110B which are placed facing a plane on the +Z side of reticle stage RST and reticle R (the side of illumination unit IOP) via a predetermined clearance (clearance gap/distance/gap/spatial distance), in an area between illumination unit IOP and reticle R where illumination light IL is not interrupted. And, space 181 serves as a first purge space, which includes the optical path of illumination light IL between illumination unit IOP and projection optical system PL and is purged with a purge gas such as, for example, CDA, and proximity cooling devices 110A and 110B also serve as a partition wall which isolates the first purge space 181 against the outside air. Therefore, by proximity cooling devices 110A and 110B, temperature control (cooling) of reticle R held by reticle stage RST during the exposure operation by the step-and-scan method can be performed. Especially, in the embodiment, because the apparatus is equipped with proximity cooling devices 110A and 110B placed on both sides in the y-axis direction with respect to the illumination area, it becomes possible to control the temperature distribution of reticle R, such as for example, to control the temperature so that the entire surface of reticle R becomes a uniform temperature.

Further, by setting the clearance with reticle stage RST, or to be more precise, the clearance (clearance gap/distance/gap/spatial distance) between end covers $23_1$ and $23_2$ and proximity cooling devices 110A and 110B to a minute dimension which nearly blocks the gas flow, the first purge space 181 which is in a substantially airtight state enclosed by purge cover 80, proximity cooling devices 110A and 110B, and reticle stage RST and/or reticle R can be created. In other words, it no longer becomes necessary to surround reticle stage RST holding reticle R with a large air-tight shielding container. Further, because the space in the substantially airtight state described above is the first purge space 181 with which the purge gas is purged, various kinds of benefits responding to the characteristic of the purge gas occur. For example, in the case of using CDA as the purge gas, haze of reticle R can be effectively prevented. Furthermore, because proximity cooling devices 110A and 110B also serve as a partition wall which isolates purge space 181 from the outside air, in this point as well, the space where purge is performed can be secured without increasing the size of the device more than necessary.

In the embodiment, because temperature control (cooling) of reticle R held by reticle stage RST during the exposure operation by the step-and-scan method can be performed as described above, generation of distortion of the pattern due to thermal expansion of the reticle can be suppressed without bringing about a decrease in throughput, which as a consequence, causes expectations on improvement in the overlay accuracy. Further, because cooling of reticle R is performed by proximity cooling devices 110A and 110B using radiative heat transfer, generation of defects and the like of circuit elements such as raising particles (so-called dust), adhesion of particles on the reticle and the like can be suppressed. In addition, because haze of reticle R can be effectively prevented, it becomes possible to stop the generation of pattern defects and variation of CD (Critical Dimension) beforehand which occur due to haze that has grown on the reticle being transferred onto the wafer. Further, because it is not necessary to perform inspection on the reticle frequently to prevent such defects, as a consequence, productivity can be kept from decreasing, which in turn makes it possible to improve the productivity.

Incidentally, in the second embodiment described above, for example, a radiation thermometer and the like which measures the temperature of reticle R can be provided, and the heat quantity given to reticle R can be predicted (or temperature control of the cooling device can be performed) based on the temperature measured by the radiation thermometer. Further, the control method of the cooling device is not limited to the one describe above, and other methods can also be employed. For example, one of, or both of the temperature sensors which measure the temperature of reticle R and monitors the temperature of the cooling device do not have to be arranged, and the control pattern of the cooling device can be decided, for example, by an experiment or a simulation which is performed beforehand.

Incidentally, in the first and second embodiments, while the case has been described where the length in the X-axis direction of the opposing member (in the first embodiment, plate sections $82_3$ and $82_4$ that have a plate shape of purge cover 80, and in the second embodiment, proximity cooling devices 110A and 110B) which faces reticle stage RST (including end covers $23_1$ and $23_2$) via a predetermined clearance gap, is set slightly longer or around the same as the distance between the outer periphery of air slider sections $22_1$ and $22_2$ in the X-axis direction, this is a mere example. In other words, the opposing member which faces reticle stage RST (including end covers $23_1$ and $23_2$) via a predetermined clearance gap does not have to be a member whose entire surface is flat, and only has to have a planar section which does not interfere with the movement of the reticle stage at the time of scanning exposure and whose length in the X-axis direction is enough to substantially maintain the air-tightness between reticle stage RST at the time of such movement. In other words, the section outside the planar section in the X-axis direction can be bent downward or upward, or can be protruded. Further, from another point of view, the upper surface of the part (equivalent to air slider sections $22_1$ and $22_2$ described above) on both sides in the X-axis direction outside of the mounting area of reticle stage RST can be set to a height flush with the upper surface of reticle R, or can be a different height. In the former case, in order to maintain the air-tightness (the level of air-tightness should be at a level where the control accuracy of the humidity in the space is maintained as is previously described) in the space above the reticle, it is preferable to provide an opposing surface in the opposing member (in the first embodiment, plate sections $82_3$ and $82_4$ that have a plate shape of purge cover 80, and in the second embodiment, proximity cooling devices 110A and 110B) that faces the upper surface of the part on both sides in the X-axis direction outside of the mounting area of reticle stage RST via a predetermined clearance gap.

Incidentally, in the first and second embodiments, it is desirable that reticle stage RST (including end covers $23_1$ and $23_2$) nears the opposing member (in the first embodiment, plate sections $82_3$ and $82_4$ that have a plate shape of purge cover 80, and in the second embodiment, proximity cooling devices 110A and 110B) in the Z-axis direction as much possible within the range so that the upper surface of reticle R does not come into contact with the opposing member at the time of scanning exposure (at the time of synchronous movement with wafer stage WST). Especially in the second embodiment, the cooling efficiency of reticle R by proximity cooling devices 110A and 110B improves. Further, when the clearance gap with the opposing member becomes smaller than a certain level, a proximity cooling device not only by a radiative heat transfer method but also by a thermal conduction method can also be used. Further, it is desirable that rotation in the θx direction (that is, pitching) and rotation in the θy direction (that is, rolling) are controlled so that reticle stage RST is parallel as much as possible to the opposing member.

Further, in the first and second embodiments, depending on the setting of a relation of the length in the Y-axis direction and a positional relation between reticle stage RST, reticle R and the opposing surface section of the opposing member, the opposing surface section (for example, plate sections $82_3$ and $82_4$) of the opposing member can face only reticle stage RST, reticle stage RST and the reticle (or only the reticle). Also depending on the setting of a relation of the length in the X-axis direction and a positional relation between reticle stage RST, reticle R and the opposing surface section of the opposing member, the opposing surface section (for example, plate sections $82_3$ and $82_4$) of the opposing member can face only reticle stage RST, reticle stage RST and the reticle (or only the reticle).

Incidentally, in the second embodiment, the measurement system used to measure the positional information of reticle stage RST is not limited to the encoder system, and can also be other measurement systems such as an interferometer system. Further proximity cooling device 110A, 110B do not have to serve as a partition of the purge space, and it needs not to be used together with gas purges such as CDA of the reticle stage head space.

Further, in the second embodiment above, while the case has been described where proximity cooling devices 110A and 110B are installed in the illumination area on both sides in the Y-axis direction of the irradiation area of illumination light IL, being provided only on one side is also acceptable. Further, the size of the cooling surface of proximity cooling devices 110A and 110B can be equal to the reticle, or can be equal to the patterned area of the reticle. During the non-exposure operation (for example, during wafer exchange and the like), reticle stage RST can be moved to make reticle R face one of the proximity cooling devices so that reticle R can be cooled. Further, in this case, because there is no risk of the proximity cooling device and reticle R coming into contact and the like, the cooling can be performed by making proximity cooling device and reticle R move closer than at the time of exposure.

Incidentally, by cooling (controlling the temperature of) the reticle using the cooling device, as well as preventing deformation caused by thermal expansion of the reticle, the displacement of the patterned surface in the Z-axis direction which accompanies the deformation can also be prevented.

Incidentally, in the first and second embodiments above, with regard to reticle stage RST having a pair of slider sections $22_1$ and $22_2$ which is fixed to main body section 22 and to both ends in the X-axis direction of main body section 22, and the length in the Y-axis direction is longer than main body section 22, the case has been described where end covers $23_1$ and $23_2$ are used to surround the +Y end and the −Y end of air slider sections $22_1$ and $22_2$. However, as well as this, the end covers do not necessarily have to be provided if a structure is employed where reticle stage RST surrounds reticle R with side-walls all around in every direction. The point is, any structure is possible as long as a substantially air tight space can be formed above reticle R and below illumination system, by a pair of cover members facing the upper surface of the reticle stage via a predetermined clearance (clearance gap/distance/gap/spatial distance).

Further, in the second embodiment described above, while the case has been described where the first purge space 181 and the second purge space 182 were both purged with CDA whose humidity is 1% or less, CDA whose humidity is 10% or less can also be used as the purge gas. Further, as well as this, the type of purge gas to be used in the first purge space 181 and the second purge space 182 can be different. Further, while gas such as CDA whose ratio of moisture is small when compared to normal air can be used as the purge gas, as well as this, rare gas such as, for example, nitrogen and helium which do not include substances responsible for haze, such as for example, ammonium sulfate or ammonium carbonate, hydrocarbon, carboxylic acid, cyanuric acid, or molecular contaminants such as other carbon-based molecules, and also hardly absorbs illumination light IL can be used as the purge gas.

Incidentally, the encoder head is not limited to a two-dimensional head (a 2DOF sensor), and can also be a one-dimensional head (a 1DOF sensor) or a three-dimensional head (a 3DOF sensor) whose measurement direction is in three directions which are the X-axis, the Y-axis, and the Z-axis directions.

Incidentally, in the first and second embodiments above, while an example has been described where the positional information of reticle stage RST within the XY plane is obtained (measured) by reticle encoder system 70, besides this, instead of encoder system 70, or along with encoder system 70, the interferometer system can be used to measure the positional information.

Incidentally, in the first and second embodiments described above, while the case has been described where the exposure apparatus was a dry type exposure apparatus that performs exposure of wafer W without liquid (water), as well as this, as is disclosed in, for example, PCT International Publication No. 99/49,504, EP Patent Application Publication No. 1,420,298, PCT International Publication No. 2004/055803, the first and second embodiments described above can also be applied to an exposure apparatus which has a liquid immersion space including an optical path of the illumination light between a projection optical system and a wafer, and exposes the wafer with the illumination light via the projection optical system and the liquid in the liquid immersion space. Further, the first and second embodiments described above can be applied to a liquid immersion exposure apparatus and the like whose details are disclosed in, for example, U.S. Patent Application Publication No. 2008/008843 and the like.

Further, in the first and second embodiments described above, while a case has been described where the exposure apparatus was a scanning exposure apparatus by a step-and-scan method, as well as this, each of the embodiments above can also be applied to a reduction projection exposure apparatus by a step-and-stitch method that synthesizes a shot area and a shot area, an exposure apparatus by a proximity method, a mirror projection aligner and the like. Moreover, the first and second embodiments described above can also be applied to a multi-stage type exposure apparatus equipped with a plurality of wafer stages, as is disclosed in, for example, U.S. Pat. No. 6,590,634, U.S. Pat. No. 5,969,441, U.S. Pat. No. 6,208,407 and the like. Further, the first and second embodiments described above can also be applied to an exposure apparatus equipped with a measurement stage including a measurement member (for example, a reference mark, and/or a sensor and the like) different from the wafer stage, as disclosed in, for example, International Publication No. 2005/074014.

Further, the magnification of the projection optical system in the exposure apparatus of the first and second embodiments described above is not limited only to a reduction system, but also can be either an equal magnifying system or a magnifying system, and the projection optical system is not limited only to a dioptric system, but also can be either a catoptric system or a catadioptric system, and the projected image can be either an inverted image or an upright image.

Further, as illumination light IL, besides the ArF excimer laser beam (wavelength 193 nm), other vacuum ultraviolet light such as the $F_2$ laser beam (wavelength 157 nm), a far ultraviolet light such as the KrF excimer laser beam (wavelength 248 nm), or an emission line (a g-line wavelength 436 nm, or an i-line wavelength 365 nm and the like) from an extra-high pressure mercury lamp can also be used. Further, as the vacuum ultraviolet light, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet region using a nonlinear optical crystal, can also be used.

Moreover, as disclosed in, for example, U.S. Pat. No. 6,611,316, the first and second embodiments above can also be applied to an exposure apparatus that synthesizes two reticle patterns via a projection optical system and almost simultaneously performs double exposure of one shot area by one scanning exposure.

Incidentally, in the embodiment above, the object (an object subject to exposure which is irradiated with an energy beam) on which the pattern is to be formed is not limited to wafers, and other objects can also be used such as glass plates, ceramic substrates, or mask blanks.

Further, the exposure apparatus of the first and second embodiments above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of all publications, the PCT International Publications, the U.S. Patent Applications and the U.S. Patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the first and second embodiments previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus the first and second embodiments described above, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that has an illumination optical system configured to illuminate a mask with an illumination light and a projection optical system configured to project a pattern image of the mask onto a substrate, and performs scanning exposure of the substrate by moving each of the mask and the substrate relative to the illumination light, the apparatus comprising:

a body mechanism having a metrology frame and a surface plate, the metrology frame supporting the projection optical system, and the surface plate being placed above the projection optical system and having an opening through which the illumination light passes;

a stage that has a slider and is placed on the surface plate, the slider having a chuck member that holds the mask in an opening through which the illumination light passes, the slider being movable in a first direction within a predetermined plane orthogonal to an optical axis of the projection optical system, and the mask being moved in the first direction in the scanning exposure;

a drive system that has a motor and moves the stage by the motor, a part of the motor being provided at the stage; and a partition wall member that is placed between the illumination optical system and the stage, and forms a first space containing an optical path of the illumination light, wherein the partition wall member has a cylindrical section and a pair of plate shaped sections, the cylindrical section surrounding the optical path, and the pair of plate shaped sections being placed on a lower end side of the cylindrical section and being provided extending on one side and an other side of the cylindrical section in the first direction, respectively, the pair of plate shaped sections each have a lower surface facing an upper surface of the stage that is moved below the pair of plate shaped sections in the scanning exposure, and are each placed so that the lower surface is substantially parallel to the predetermined plane, and in the scanning exposure, the stage is moved while the upper surface of the stage is in proximity to the lower surfaces of the pair of plate shaped sections so that the first space is substantially airtightly formed by the partition wall member, the stage and the mask.

2. The exposure apparatus according to claim 1, wherein in the scanning exposure, the stage is moved while an upper surface of the slider in which the opening is formed is in proximity to the lower surfaces of the pair of plate shaped sections.

3. The exposure apparatus according to claim 1, wherein the slider has a cover member having an upper surface on each of one end side and an other end side of the first direction, and in the scanning exposure, the stage is moved while the upper surfaces of the cover members are in proximity to the lower surfaces of the pair of plate shaped sections.

4. The exposure apparatus according to claim 1, wherein
the cylindrical section has an upper end side connected to the illumination optical system, and
the first space serves as a purge space into which a gas having a humidity of 10% or less than 10% is supplied.

5. The exposure apparatus according to claim 1, wherein
the first space serves as a purge space into which clean dry air having a humidity of 1% or less than 1% is supplied.

6. The exposure apparatus according to claim 5, further comprising:
a second partition wall member that forms a second space containing the optical path of the illumination light, between the projection optical system and the stage, wherein
the second space is formed substantially airtightly by the second partition wall member, the surface plate, the stage and the mask.

7. The exposure apparatus according to claim 6, wherein
the second partition wall member has an upper end side connected to the surface plate and a lower end side connected to the projection optical system, and
the second space serves as a purge space into which clean dry air having a humidity of 1% or less than 1% is supplied.

8. The exposure apparatus according to claim 5, further comprising:
a cooling member placed so that the stage that is moved by the drive system comes into proximity with the cooling member, the cooling member cooling at least one of the slider and the mask.

9. The exposure apparatus according to claim 8, wherein
the cooling member is provided as at least a part of the pair of plate shaped sections.

10. The exposure apparatus according to claim 5, further comprising:
a countermass having a frame shape that is placed on the surface plate and surrounds the slider, wherein
the motor has a pair of movers placed with the opening of the slider between the pair of movers in a second direction orthogonal to the first direction within the predetermined plane, and a pair of stators placed at the countermass, the motor being capable of moving the stage in a plurality of directions including the first direction.

11. The exposure apparatus according to claim 10, wherein
the chuck member has a pair of vacuum chucks that are placed apart in the second direction in the opening of the slider and each hold a lower surface of the mask,
the stage has a fixing device that is placed at the slider and presses the mask at a plurality of points, and
the mask is held by the slider using the pair of vacuum chucks and the fixing device.

12. The exposure apparatus according to claim 10, wherein
the surface plate is provided via a plurality of vibration isolation units, and
the exposure apparatus further comprises:
a plurality of actuators that drive the surface plate supported by the plurality of vibration isolation units.

13. A device manufacturing method, comprising:
exposing a substrate using the exposure apparatus according to claim 1; and
developing the substrate that has been exposed.

14. A method of making an exposure apparatus that has an illumination optical system configured to illuminate a mask with an illumination light and a projection optical system configured to project a pattern image of the mask onto a substrate, and performs scanning exposure of the substrate by moving each of the mask and the substrate relative to the illumination light, the method comprising:
providing a body mechanism having a metrology frame and a surface plate, the metrology frame supporting the projection optical system, and the surface plate being placed above the projection optical system and having an opening through which the illumination light passes;
providing a stage that has a slider and is placed on the surface plate, the slider having a chuck member that holds the mask in an opening through which the illumination light passes, the slider being movable in a first direction within a predetermined plane orthogonal to an optical axis of the projection optical system, and the mask being moved in the first direction in the scanning exposure;
providing a drive system that has a motor and moves the stage by the motor, a part of the motor being provided at the stage; and
providing a partition wall member that is placed between the illumination optical system and the stage, and forms a first space containing an optical path of the illumination light, wherein
the partition wall member has a cylindrical section and a pair of plate shaped sections, the cylindrical section surrounding the optical path, and the pair of plate shaped sections being placed on a lower end side of the cylindrical section and being provided extending on one side and an other side of the cylindrical section in the first direction, respectively,
the pair of plate shaped sections each have a lower surface facing an upper surface of the stage that is moved below the pair of plate shaped sections in the scanning exposure, and are each placed so that the lower surface is substantially parallel to the predetermined plane, and
in the scanning exposure, the stage is moved while the upper surface of the stage is in proximity to the lower surfaces of the pair of plate shaped sections so that the first space is substantially airtightly formed by the partition wall member, the stage and the mask.

* * * * *

UNITED STATES PATENT AND TRADEMARK OFFICE
CERTIFICATE OF CORRECTION

PATENT NO.        : 9,874,823 B2
APPLICATION NO.   : 14/853021
DATED             : January 23, 2018
INVENTOR(S)       : Yuichi Shibazaki It is certified that error appears in the above-identified patent and that said Letters Patent is hereby corrected as shown below:

On the Title Page

On page 2, under the heading "Other Publications":
Change "Aug. 13, 2013" to -- Aug. 30, 2013 -- before "Restriction Requirement issued in U.S. Appl. No. 12/851,857."
Add -- U.S. Appl. No. 14/854,933 filed Sep. 15, 2015 in the name of Yuichi SHIBAZAKI. --

Signed and Sealed this
First Day of May, 2018

Andrei Iancu
*Director of the United States Patent and Trademark Office*